United States Patent
Chiang et al.

(10) Patent No.: US 11,450,401 B2
(45) Date of Patent: Sep. 20, 2022

(54) METHOD, SYSTEM AND COMPUTER PROGRAM PRODUCT FOR MEMORY REPAIR

(71) Applicant: TAIWAN SEMICONDUCTOR MANUFACTURING COMPANY, LTD., Hsinchu (TW)

(72) Inventors: Katherine H. Chiang, Hsinchu (TW); Chien-Hao Huang, Hsinchu (TW); Cheng-Yi Wu, Hsinchu (TW); Chung-Te Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/108,870

(22) Filed: Dec. 1, 2020

(65) Prior Publication Data
US 2021/0375385 A1    Dec. 2, 2021

Related U.S. Application Data

(60) Provisional application No. 63/031,827, filed on May 29, 2020.

(51) Int. Cl.
| | | |
|---|---|---|
| *G11C 29/00* | (2006.01) | |
| *G11C 29/44* | (2006.01) | |
| *G11C 29/42* | (2006.01) | |
| *G11C 29/24* | (2006.01) | |
| *G11C 29/12* | (2006.01) | |

(52) U.S. Cl.
CPC ............. *G11C 29/44* (2013.01); *G11C 29/24* (2013.01); *G11C 29/42* (2013.01); *G11C 2029/1202* (2013.01); *G11C 2029/1204* (2013.01)

(58) Field of Classification Search
CPC ....................................................... G11C 29/44
See application file for complete search history.

(56) References Cited

U.S. PATENT DOCUMENTS

| | | | | |
|---|---|---|---|---|
| 11,100,524 B1* | 8/2021 | Ross | ...................... | G06N 5/003 |
| 2010/0169705 A1* | 7/2010 | Fujii | ...................... | G11C 29/72 |
| | | | | 714/6.12 |
| 2013/0262740 A1* | 10/2013 | Kim | ...................... | G06F 12/0246 |
| | | | | 711/102 |

OTHER PUBLICATIONS

Alejandro Arbelaez, Youssef Hamadi, Michele Sebag. "Online Heuristic Selection in Constraint Programming". 2009. HAL Id: inria-00392752.

* cited by examiner

*Primary Examiner* — Min Huang
(74) *Attorney, Agent, or Firm* — Hauptman Ham, LLP

(57) ABSTRACT

A location of at least one fail bit to be repaired in a memory block of a memory is extracted from at least one memory test on the memory block. An available repair resource in the memory for repairing the memory block is obtained. It is determined whether a Constraint Satisfaction Problem (CSP) containing a plurality of constraints is solvable. The constraints correspond to the location of the at least one fail bit in the memory block, and the available repair resource. In response to determining that the CSP is not solvable, the memory block is marked as unrepairable or the memory is rejected. In response to determining that the CSP is solvable and has a solution satisfying the constraints, the at least one fail bit is repaired using the available repair resource in accordance with the solution of the CSP.

20 Claims, 6 Drawing Sheets

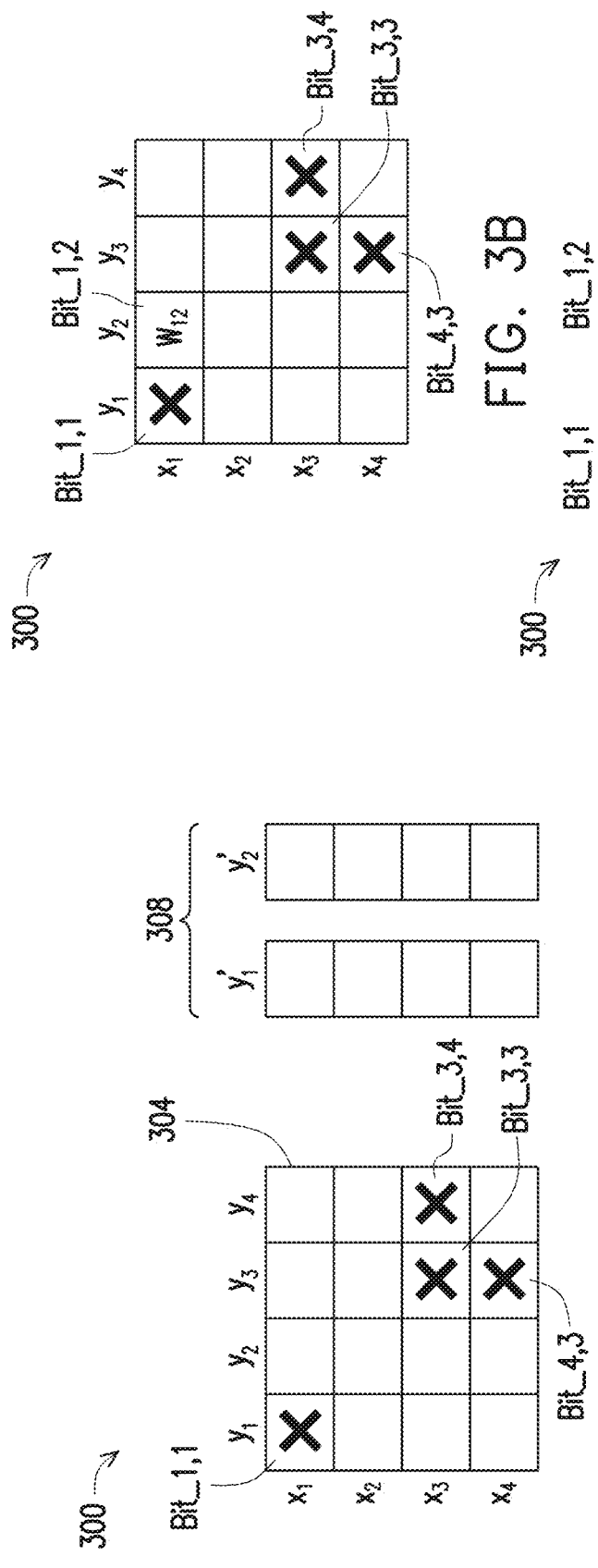
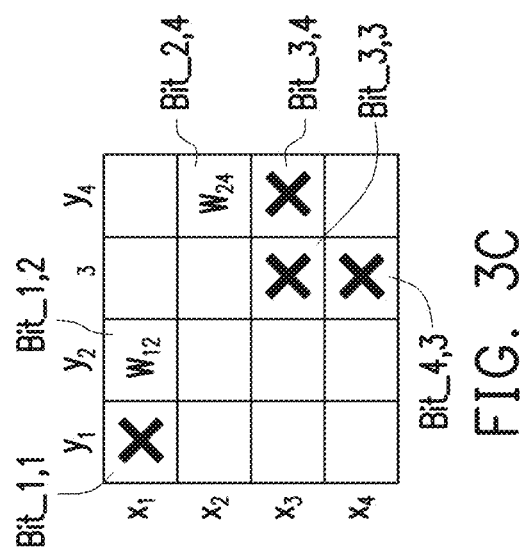
FIG. 3A
FIG. 3B
FIG. 3C

METHOD, SYSTEM AND COMPUTER PROGRAM PRODUCT FOR MEMORY REPAIR

RELATED APPLICATION(S)

The instant application claims the benefit of U.S. Provisional Application No. 63/031,827, filed May 29, 2020, the entirety of which is incorporated by reference herein.

BACKGROUND

Memories are components of electronic devices. Memory quality is a consideration, because a defect in a memory potentially affects performance and/or functions of not only the defective memory, but also one or more other integrated circuits (ICs) that include or access the defective memory. Memory testing and repairing are techniques developed to address this consideration.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3E are schematic diagrams of a memory block, showing test results of at least one memory test on the memory block, in accordance with some embodiments.

DETAILED DESCRIPTION

Figures 1A, 1B:
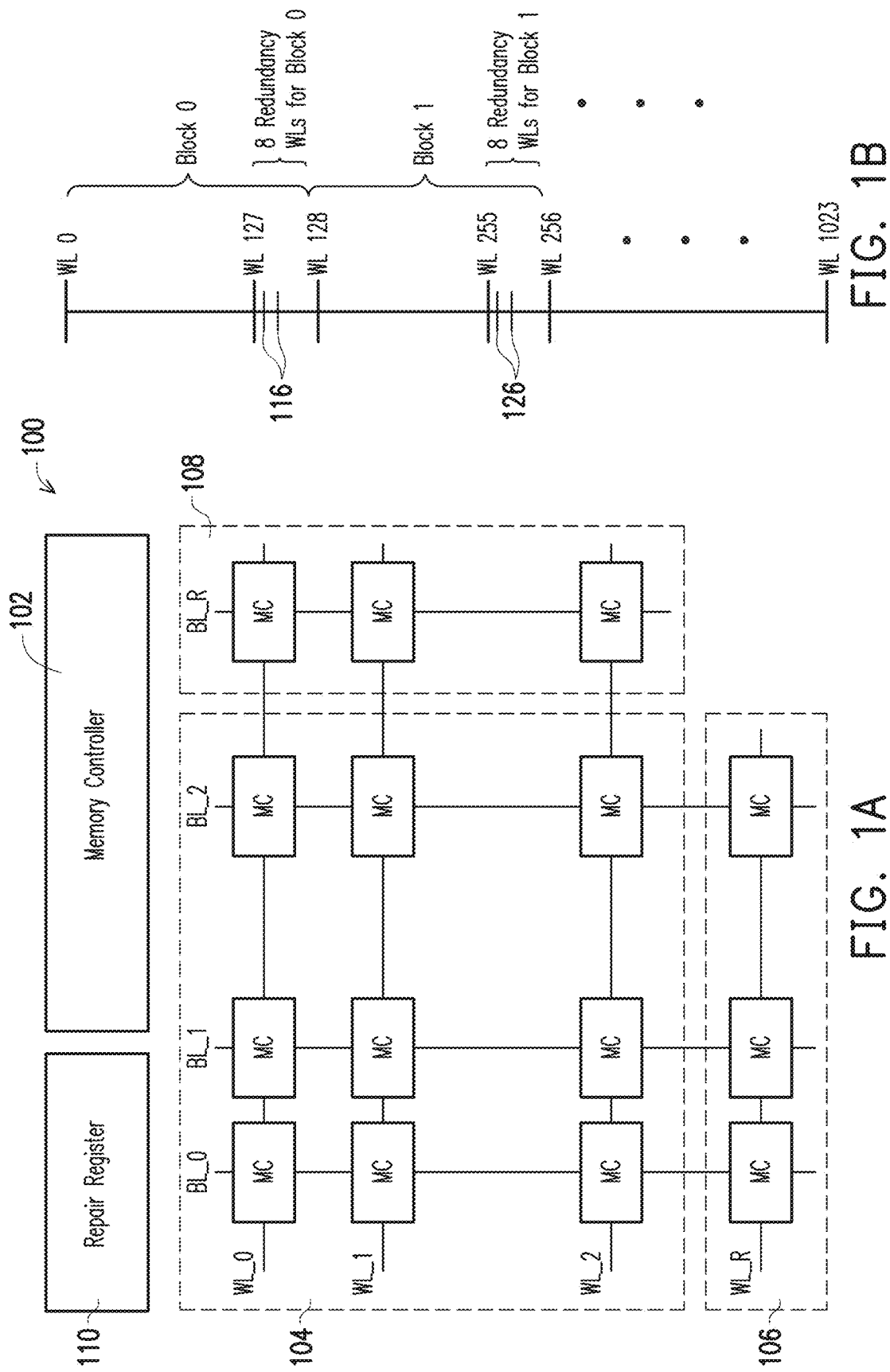
FIG. 1A is a schematic block diagram of a memory, in accordance with some embodiments.
FIG. 1B is a schematic diagram illustrating an example repair resource deployment rule in a memory, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

When a memory undergoes at least one memory test, one or more fail bits and/or weak bits are found in the memory. A fail bit, also referred to as a "hard error," is an error that occurs multiple times at the same location (or bit). A weak bit, also referred to as a "soft error," is an error that occurs randomly and is not repeated at the same location (or bit) multiple times. To ensure proper functionality of the memory, fail bits are to be repaired using a repair resource available in the memory as described herein. In at least one embodiment, it is acceptable to not repair weak bits; however, when the repair resource remaining after repairing the fail bits is sufficient, one or more of the weak bits are repaired using the remaining repair resource.

In some embodiments, a decision whether it is possible to repair a pattern of fail bits (also referred to as a "fail bit pattern") in a memory block of a memory is formulated as a Constraint Satisfaction Problem (CSP). When the CSP is not solvable, the memory block is marked as unrepairable or the memory is rejected. When the CSP is solvable, a solution of the CSP is used to allocate the available repair resource in the memory to repair the fail bits. In some embodiments, a decision how to repair, in addition to the fail bits and where the available repair resource permits, one or more weak bits in the memory block is formulated as a Constraint Optimization Problem (COP) based on weakness levels of the weak bits. A solution of the COP is used to allocate the available repair resource to repair one or more of the weak bits, in addition to repairing all fail bits. In some embodiments, machine learning is applied to determine whether a fail bit pattern is unrepairable before attempting to solve a CSP. In some embodiments, an unsolvable CSP is used to update a result of the machine learning. In some embodiments, machine learning is applied to optimize a solving algorithm (also referred to as a "heuristic") of a CSP and/or a COP. In at least one embodiment, it is possible to achieve one or more effects including, but not limited to, quick and/or early decisions on whether a memory with fail bits is repairable, repair of as many weak bits as possible, preferential repair of weakest bits over other weak bits, preferential allocation of a repair resource with higher quality over another repair resource with lower quality, quick convergence toward an optimal heuristic for solving a CSP and/or a COP. As a result, time and/or quality of memory repair is/are improved in one or more embodiments.

FIG. 1A is a schematic block diagram of a memory 100, in accordance with some embodiments.

In at least one embodiment, the memory 100 is an individual or standalone memory. In some embodiments, the memory 100 is included as a part of a larger IC device which comprises circuitry other than the memory 100 for other functionalities. For example, the memory 100 in at least one embodiment is an embedded memory in a system-on-chip (SOC) IC device. Examples of the memory 100 include, but are not limited to, a non-volatile memory, a non-volatile reprogrammable memory, a random access memory (RAM), or the like.

The memory 100 comprises a plurality of memory cells MC, and a memory controller (such as a control circuit) 102 electrically coupled to the memory cells MC and configured to control operations of the memory cells MC including, but not limited to, a read operation, a write operation (or programming operation), or the like. Each memory cell MC is also referred to herein as a "bit." The term "bit" is for simplicity, and does not necessarily indicate the storage capability of each memory cell MC. In some embodiments, each memory cell MC is configured to store a bit of data. In one or more embodiments, each memory cell MC is configured to store multiple bits of data.

The memory cells MC are arranged in a plurality of columns and rows in a memory array 104. The memory 100 further comprises a plurality of word lines (also referred to as "address lines") WL_0 to WL_M extending along the rows, and a plurality of bit lines (also referred to as "data lines") BL_0 to BL_N extending along the columns of the memory cells MC. Each of the memory cells MC is electrically coupled to the memory controller 102 by at least one of the word lines, and at least one of the bit lines. In some example operations, word lines are configured for transmitting addresses of the memory cells MC to be read from, or for transmitting addresses of the memory cells MC to be written to, or the like. In at least one embodiment, a set of word lines is configured to perform as both read word lines and write word lines. Examples of bit lines include read bit lines for transmitting data read from the memory cells MC indicated by corresponding word lines, write bit lines for transmitting data to be written to the memory cells MC indicated by corresponding word lines, or the like. In at least one embodiment, a set of bit lines is configured to perform as both read bit lines and write bit lines. The word lines are commonly referred to herein as WL, and the bit lines are commonly referred to herein as BL. Various numbers of word lines and/or bit lines in the memory array 104 are within the scope of various embodiments.

The memory 100 further comprises one or more redundant rows 106 of memory cells MC, and one or more redundant columns 108 of memory cells MC for repairing fail bits and/or weak bits in the memory array 104. The memory cells MC in each redundant row 106 are coupled to a redundant WL, as representatively indicated as WL_R in FIG. 1A. The memory cells MC in each redundant column 108 are coupled to a redundant BL, as representatively shown as BL_R in FIG. 1A. For simplicity, "redundant WL" or "redundant word line" herein refers to a redundant row 106 and includes not only a word line but also the memory cells MC coupled thereto. Similarly, "redundant BL" or "redundant bit line" herein refers to a redundant column 108 and includes not only a bit line but also the memory cells MC coupled thereto. The redundant word lines 106 and the redundant bit lines 108 are allocable for repairing fail bits and/or weak bits in the memory array 104, and are referred to herein as repair resources. In some embodiments, the redundant word lines 106 are allocated for row repair and the redundant bit lines 108 are allocated for column repair. In at least one embodiment, it is sufficient to repair a bit with either a row repair using a redundant word line, or a column repair using a redundant bit line. Various numbers of redundant word lines 106 and/or redundant bit lines 108 in the memory 100 are within the scope of various embodiments. In some embodiments, the numbers of the redundant word lines 106 and/or the redundant bit lines 108 depend on the size of the memory array 104 and/or a manufacturing processes for manufacturing the memory. For example, more redundant word lines 106 and/or redundant bit lines 108 are included in the memory 100 as the size of the memory array 104 becomes larger. For another example, where the manufacturing processes have higher yield, it is possible to lower the numbers of the redundant word lines 106 and/or the redundant bit lines 108. In contrast, where the manufacturing processes have lower yield, more redundant word lines 106 and/or redundant bit lines 108 are included in the memory 100.

The memory 100 further comprises a repair register 110 for storing repair information to be accessed by the memory controller 102 as described herein.

FIG. 1B is a schematic diagram illustrating an example repair resource deployment rule in a memory, in accordance with some embodiments.

In some embodiments, a memory, such as the memory 100, is divided into a number of segments or blocks (also referred to herein as "memory blocks"). In the example configuration in FIG. 1B, a memory array of the memory has 1024 word lines from word line WL 0 to word line WL 1023, and the 1024 word lines are divided into 8 segments or blocks, each having 128 word lines. For example, Block 0 includes word lines WL 0 to WL 127, Block 1 includes word lines WL 128 to WL 255, or the like. Each block further includes a number of redundant word lines allocable for repairing memory cells or bits in the same block. For example, Block 0 includes 8 redundant word lines commonly designated as 116 and arranged between word line WL 127 and WL 128, Block 1 includes 8 redundant word lines commonly designated as 126 and arranged between word line WL 255 and WL 256, or the like. In some embodiments, the redundant word lines in one block are not allocable to repair memory cells or bits in other blocks. For example, the redundant word lines 116 are allocable to repair memory cells or bits in Block 0, but are not allocable to repair memory cells or bits in other blocks.

In some embodiments, the bit lines of the memory are divided in into a number of segments or blocks. In an example (not shown), the memory array has 512 bit lines divided into 8 segments or blocks, each having 64 bit lines and 4 redundant bit lines. As a result, the memory is divided into 64 blocks. In this example, each of Block 0, Block 1 or the like includes 128 word lines, 64 bit lines, 8 redundant word lines and 4 redundant bit lines. In at least one embodiment, the redundant word lines and redundant bit lines in one block are not allocable to repair memory cells or bits in other blocks. The described configuration with various specific numbers of blocks, word lines, bit lines, redundant word lines and redundant bit lines in each block is an example. Other configurations are within the scopes of various embodiments. In at least one embodiment, a memory is not divided into memory blocks, i.e., the memory is configured to include a single memory block.

Figure 2:
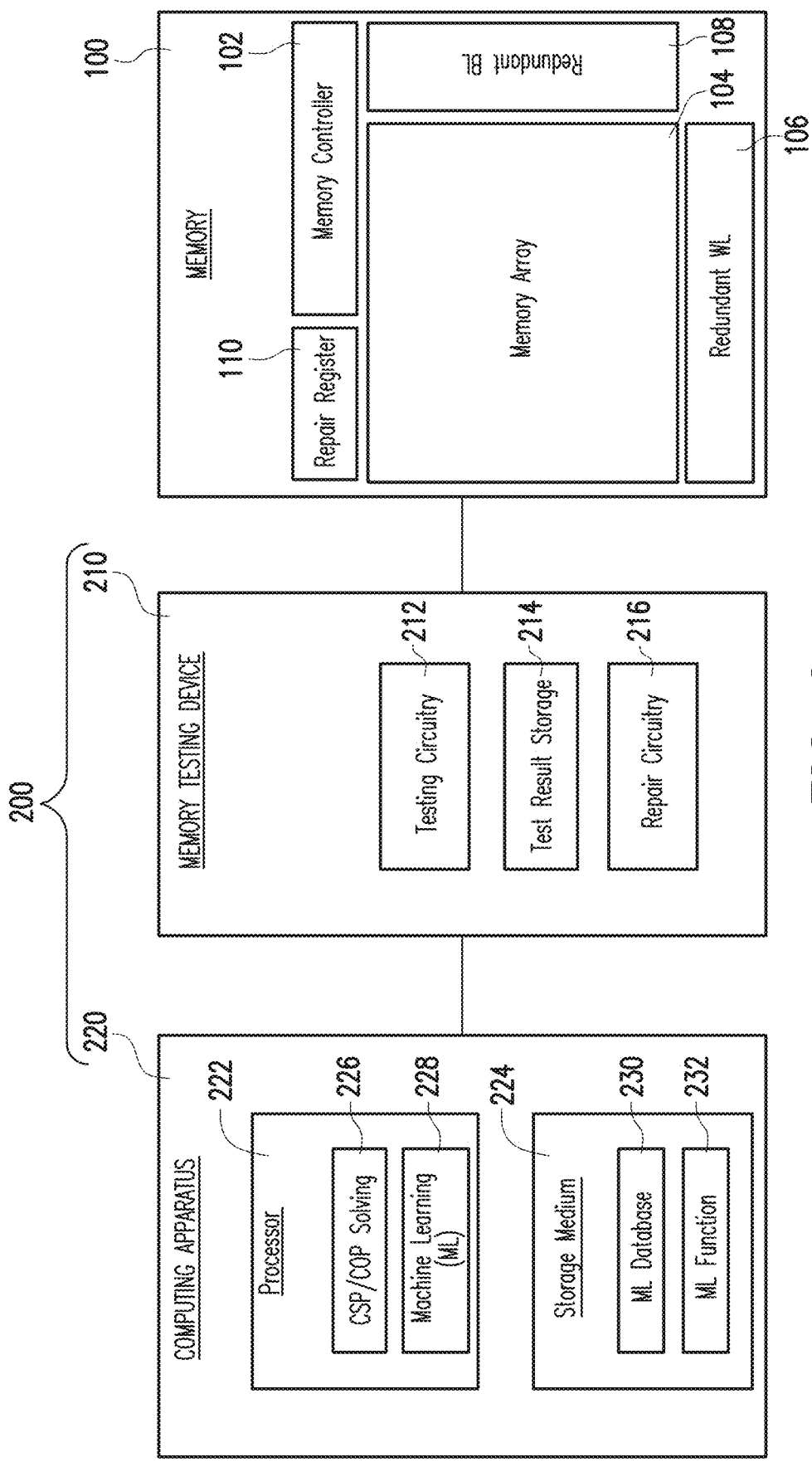
FIG. 2 is a schematic diagram of a system for testing and repairing a memory, in accordance with some embodiments.

FIG. 2 is a schematic diagram of a system 200 for testing and repairing a memory, in accordance with some embodiments. In the example configuration in FIG. 2, the memory to be tested and repaired is the memory 100.

The system 200 comprises a memory testing device 210 and a computing apparatus 220. The memory testing device 210 comprises testing circuitry 212, a test result storage 214, and repair circuitry 216. In at least one embodiment, at least one of the testing circuitry 212 or the repair circuitry 216 comprises an application specific integrated circuit (ASIC), and the test result storage 214 comprises a register. The computing apparatus 220 comprises a processor 222, and a non-transitory computer-readable storage medium 224. An example hardware computing platform of the computing apparatus 220 in accordance with some embodiments is described with respect to FIG. 5.

The testing circuitry 212 is configured to perform one or more memory tests on the memory 100. In some embodiments, the testing circuitry 212 is configured to generate and provides address sequences and test data sequences to the memory array 104 of the memory 100 during the one or more memory tests. In at least one embodiment, the address sequences and the data sequences are generated in accordance with a test pattern algorithm. In at least one embodiment, the test pattern algorithm is built-in in the testing circuitry 212. The data sequences provide a set of data to detect various types of faults or errors within the memory array 104. In at least one embodiment, the testing circuitry 212 is configured to scan the memory array 104 by row, by column, or a combination of both to test the entire memory array 104. In at least one embodiment, the redundant word lines 106 and the redundant bit lines 108 are also tested by the testing circuitry 212 in the one or more memory tests.

The test result storage 214 is configured to store or record a test result of the one or more memory tests performed by the testing circuitry 212. For example, the testing circuitry 212 is configured to write into the test result storage 214 an address or location of a bit where an error occurred in one of the memory tests. In some embodiments, the address or location of the bit with the error comprises information indicating the word line and the bit line coupled to the bit. In at least one embodiment, the testing circuitry 212 is configured to write into the test result storage 214 additional information related to an error, e.g., a weakness level of a weak bit.

The computing apparatus 220 is coupled to the memory testing device 210 to enable the processor 222 to access, retrieve or receive the test result from the test result storage 214. In at least one embodiment, the computing apparatus 220 is coupled to the memory testing device 210 via a communication port or a network. Other configurations are within the scopes of various embodiments, as described herein.

In some embodiments, the processor 222, based on the test result retrieved from the memory testing device 210, is configured to determine whether the memory 100 is repairable or not, and in response to a determination that the memory 100 is repairable, determine how to allocate the repair resource available in the memory 100 for repairing the memory 100. In at least one embodiment, the processor 222 is configured to make one or more of such determinations by solving a CSP and/or a COP, as schematically indicated at 226. Detailed descriptions of CSP and/or COP are given herein with respect to FIG. 4.

In some embodiments, the processor 222 is further configured to perform machine learning (ML), as schematically indicated at 228. In the example configuration in FIG. 2, data for the machine learning are stored in an ML database 230 on the storage medium 224. A result of the machine learning is generated by the processor 222 in the form of a machine learned (ML) function 232, and is stored in the storage medium 224. The processor 222 is configured to use the ML function 232 to apply the results of the machine learning to expedite a determination whether the memory 100 is repairable or not and/or to optimize a heuristic of the CSP and/or the COP. Detailed descriptions of machine learning are given herein with respect to FIG. 4.

In some embodiments, the processor 222 is further configured to provide repair information to the repair circuitry 216 to repair one or more bits in the memory 100. For example, the repair information includes a repair address or location of a bit to be repaired in the memory 100, and a corresponding address of a redundant word line and/or a redundant bit line allocated for repairing the bit. The repair circuitry 216 is configured to repair the bit by recording, in the repair register 110 of the memory 100, the addresses in the repair information received from the processor 222. When the memory 100 is later operated in a read operation or a write operation, the memory controller 102 is configured to check the read or write address against the repair addresses stored in the repair register 110 to verify whether the read or write address is included in the repair register 110. In response to a positive answer, the memory controller 102 is configured to perform the read or write operation based on the corresponding address of the redundant word line and/or the redundant bit line allocated for the repair. The described configuration is an example. Other configurations are within the scopes of various embodiments.

In some embodiments, for example, as illustrated in FIG. 2, the memory testing device 210 is external automated testing equipment which is coupled to input/output (I/O) pins (not shown) of the memory 100 to perform one or more memory tests on the memory 100. When a repair of one or more bits of the memory 100 is to be performed, the memory testing device 210 is configured to write repair information into the repair register 110 of the memory 100 for access by the memory controller 102 after the repair. Upon conclusion of the memory tests and/or the repair, the memory testing device 210 is physically and electrically disconnected from the memory 100.

In some embodiments, one or more circuitry and/or components of the memory testing device 210 is/are configured as part of the memory 100. For example, in at least one embodiment, the memory testing device 210 is included in the memory 100, as a built-in self-test (BIST) circuit, a built-in self-repair (BISR) circuit, or both BIST and BISR circuits.

In some embodiments, one or more components of the computing apparatus 220 is/are included in the memory testing device 210 which is external automated testing equipment. For example, the processor 222 is included in the memory testing device 210 in at least one embodiment. For another example, both the processor 222 and the storage medium 224 are included in the memory testing device 210 in at least one embodiment.

In some embodiments, the processor 222 is not configured to perform machine learning. Instead, the machine learning is performed by another processor (not shown) and the result of machine learning, e.g., the ML function 232, is provided to the processor 222, e.g., via a network, and stored in the storage medium 224 for implementation by the processor 222. In at least one embodiment, results of machine learning are shared across multiple memory testing and repairing systems. In one or more embodiments, the processor that is configured to perform machine learning is included in a server, for example, a cloud server.

In some embodiments, the ML database 230 for machine learning is not stored in the storage medium 224 and/or at the computing apparatus 220. Instead, the ML database 230 for machine learning is stored at a separate computing apparatus coupled, via a network, to the computing apparatus 220 and/or to the processor that is configured to perform the machine learning. In at least one embodiment, the ML database 230 is updated by data supplied from multiple memory testing and repairing systems. In one or more embodiments, the ML database 230 is maintained in a server, for example, a cloud server.

FIGS. 3A-3E are schematic diagrams of a memory block 300, showing test results of at least one memory test in accordance with some embodiments. In at least one embodiment, the memory block 300 corresponds to a block in the memory 100.

The memory block 300 comprises a memory array 304 of functional memory cells for storing data. The memory block 300 further comprises redundant rows 306 and redundant columns 308 of redundant memory cells for repairing fail bits and/or weak bits in the memory array 304, e.g., as described with respect to FIGS. 1A-1B. In at least one embodiment, the functional memory cells and the redundant memory cells are identically configured. The redundant rows 306 and redundant columns 308 configure to repair resources for repairing the memory array 304. The memory array 304 comprises m word lines and n bit lines. The redundant rows 306 comprise m' redundant word lines, and the redundant columns 308 comprise n' redundant bit lines. The word lines of the memory block 300 are indicated by $x_i$ where i=1, 2, . . . , m. The bit lines of the memory block 300 are indicated by $y_j$ where j=1, 2, . . . , n. The redundant word lines of the memory block 300 are indicated by $x'_{i'}$ where i'=1, 2, . . . , m'. The redundant bit lines of the memory block 300 are indicated by $y'_{j'}$ where j'=1, 2, . . . , n'. A location of a bit or memory cell in the memory block 300 is indicated by the corresponding bit line or redundant bit line and the corresponding word line or redundant word line coupled to the bit. For example, a functional memory cell Bit_i,j in the memory array 304 is coupled to the word line $x_i$ and the bit line $y_j$, and has a location defined as $(x_i, y_j)$. A redundant memory cell Bit_i',j in the redundant rows 306 is coupled to the redundant word line $x'_{i'}$ and the bit line $y_j$, and has a location defined as $(x'_{i'}, y_j)$. A redundant memory cell Bit_i,j' in the redundant columns 308 is coupled to the word line $x_i$ and the redundant bit line $y'_{j'}$, and has a location defined as $(x_i, y'_{j'})$. In the example configuration in FIGS. 3A-3E, m=n=4, m'=n'=2, the word lines are $x_1$, $x_2$, $x_3$, $x_4$, the bit lines are $y_1$, $y_2$, $y_3$, $y_4$, the redundant word lines are $x'_1$, $x'_2$, and the redundant bit lines are $y'_1$, $y'_2$. Other numbers of word lines, bit lines, redundant word lines and/or redundant bit lines in the memory block 300 are within the scopes of various embodiments.

In some embodiments, one or more memory tests are performed on the memory including the memory block 300, and test results for the memory block 300 are recorded, for example, as described with respect to FIG. 2. Both functional memory cells in the memory array 304 and redundant memory cells in the redundant rows 306 and redundant columns 308 are subject to the one or more memory tests. In an example, the same address sequences and the same test data sequences are supplied by the testing circuitry 212 to the memory block 300 in multiple runs, and errors occurred in the memory block 300 in each run are recorded in the test result storage 214. An example of error is where a datum written to a bit is different from a datum read from the bit. Another example of error is where a read current from a bit when the bit is read from is not sufficiently low or not sufficiently high, making it difficult or impossible to determine whether the bit stores a logic "0" or a logic "1." Other types of errors are within the scopes of various embodiments. The errors which occurred in one run are compared, e.g., by the processor 222, to the errors in other runs to determine whether an error persisted at the same location in several runs and/or an error occurred at a random location in one run but not in other runs. A persistent error at the same location corresponds to a fail bit. A random error corresponds to a weak bit.

Figures 3D, 3E:
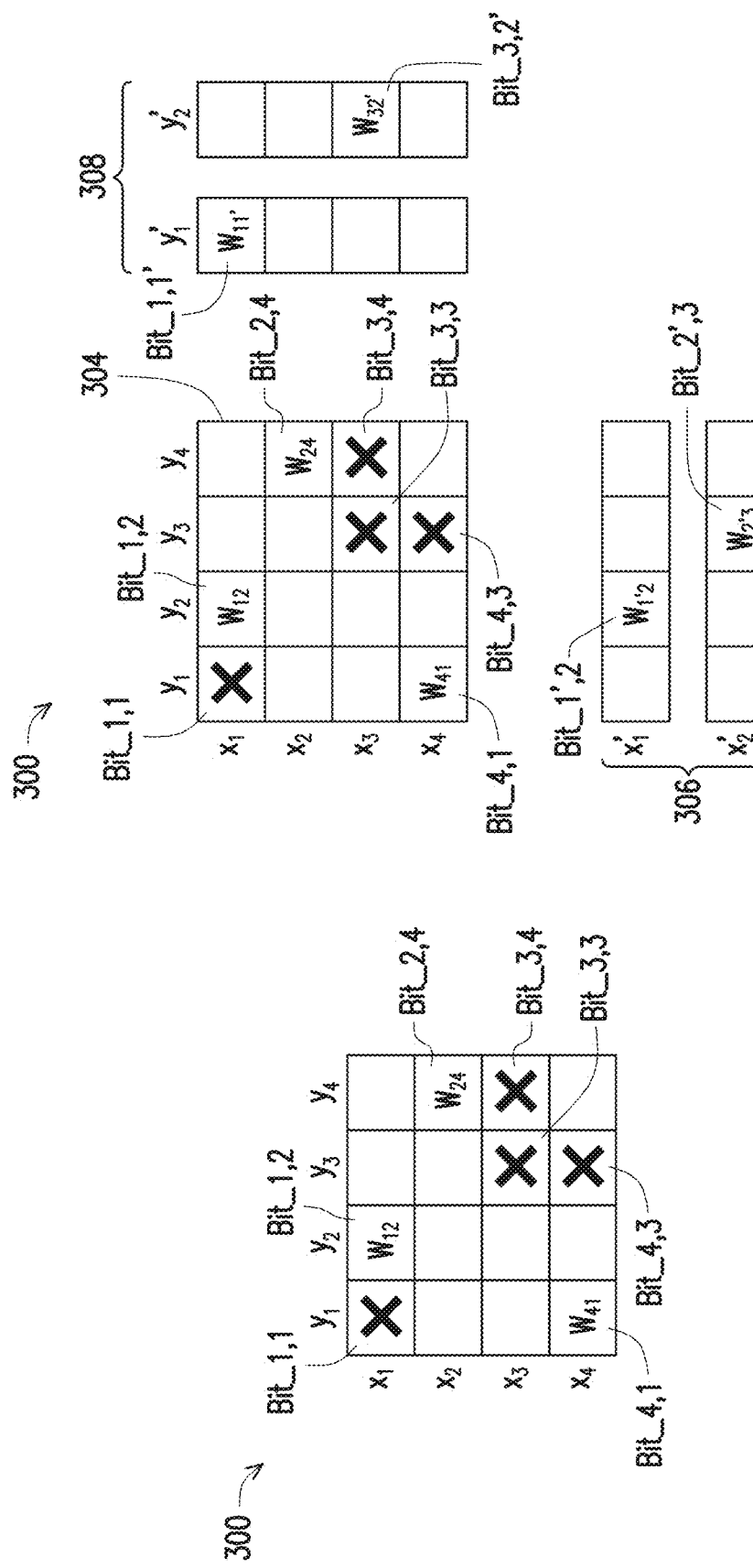

FIGS. 3A-3D show errors occurred in the memory block 300 in four different runs of at least one memory test. For simplicity, the redundant rows 306 and redundant columns 308 are omitted in FIGS. 3B-3D. As can be seen in FIGS. 3A-3D, errors were persistent in multiple runs at Bit_1,1, Bit_3,3, Bit_3,4, Bit_4,3 which are determined as fail bits and schematically indicated by label "X" in FIGS. 3A-3E. In this specific example, there were no fail bits in the redundant rows 306 and redundant columns 308. In at least one embodiment, fail bits in the memory array 304 are to be repaired, whereas fail bits in the redundant rows 306 and the redundant columns 308 are not repaired but are used to determine the available repair resources, as described herein An error occurred at Bit_1,2 in the runs corresponding to FIGS. 3B-3D, but did not occur in the run corresponding to FIG. 3A. As a result, Bit_1,2 as shown in FIGS. 3B-D is determined as a weak bit. Similarly, Bit_2,4 as shown in in FIGS. 3C-3D, and Bit_4,1 as shown in FIG. 3D are determined as weak bits. In this specific example, as shown in FIG. 3E, weak bits Bit_1_',2, Bit_2',3 in the redundant rows 306 were found in one or more of the runs corresponding to FIGS. 3B-3D, and weak bits Bit_1,1', Bit_3,2' in redundant columns 308 were found in one or more of the runs corresponding to FIGS. 3B-3D. In at least one embodiment, weak bits in the memory array 304 are repaired when repair resources are available after repairing the fail bits in the memory array 304, whereas weak bits in the redundant rows 306 and the redundant columns 308 are not repaired but are used to determine quality of the available repair resources, as described herein. Because fail bits and weak bits in redundant rows and redundant columns are not to be repaired, when a fail bit or weak bit in a memory block is described herein as being repaired or repairable, it is understood that the fail bit or weak bit being repaired or repairable corresponds to a bit or a functional memory cell in a memory array of the memory block.

In at least one embodiment, although the same address sequences and the same test data sequences are supplied by the testing circuitry 212 to the memory block 300 in multiple runs, the testing conditions, also referred to as test criteria, in each run is different from other runs. For example, in the run corresponding to FIG. 3A, a write voltage supplied to the bits of the memory block 300 to write test data therein is sufficiently high, for example, at or slightly above a nominal write voltage at which the memory block 300 is configured to operate in normal operation. The write voltage is reduced in the run corresponding to FIG. 3B, is further reduced in the run corresponding to FIG. 3C, and is at a lowest acceptable voltage level in the run corresponding to FIG. 3D. In an example, the lowest acceptable voltage level is lower than the nominal write voltage, and is a voltage level at which the memory block 300 is still expected to be operable, but a prolonged operation of the memory block 300 at that voltage level is not intended or desirable. In at least one embodiment, the lowest acceptable level of the write voltage corresponds to the tightest test criteria. Other test criteria and/or how test criteria are tightened are within the scopes of various embodiments. In the examples in FIGS. 3A-3D, errors were persistent in multiple runs at the fail bits Bit_1,1, Bit_3,3, Bit_3,4, Bit_4,3. An error first occurred at the weak bit Bit_1,2 when the test criteria are slightly tightened, as indicated in FIG. 3B. This error at the weak bit Bit_1,2 reoccurred with high probability when the test criteria are further tightened, as indicated in FIGS. 3C-3D. Similarly, an error first occurred at the weak bit Bit_2,4 when the test criteria are tightened, as indicated in FIG. 3C. This error at the weak bit Bit_2,4 reoccurred when the test criteria are further tightened, as indicated in FIG. 3D.

As the write voltage is reduced, it becomes more difficult to successfully write test data into the memory block 300, especially at weak bits. A weak bit occurrence at a higher write voltage corresponds to a lower quality of the weak bit or a higher weakness level of the weak bit. A weak bit occurrence at a lower write voltage corresponds to a higher quality of the weak bit or a lower weakness level of the weak bit. In some embodiments, different priorities or weights are assigned, e.g., by the processor 222, to the weak bits in accordance with the weakness levels of the weak bits. For example, the higher the weakness level, the higher the weight assigned to the weak bit. In some embodiments, a weight can be any positive number. Other arrangements for determining weakness levels of weak bits are within the scopes of various embodiments.

In the examples in FIGS. 3B-3D, the weak bit Bit_1,2 occurred at a higher write voltage than the weak bits Bit_2,4, Bit_4,1, and has a higher weakness level than weakness levels of the weak bits Bit_2,4, Bit_4,1. The weak bit Bit_4,1 occurred at a lower write voltage than the weak bits Bit_1,2, Bit_2,4, and has a lower weakness level than the weakness levels of the weak bits Bit_1,2, Bit_2,4. The weak bit Bit_2,4 has the weakness level between the weakness levels of the weak bits Bit_1,2 and Bit_4,1. The processor 222 is configured to assign different weights $W_{12}$, $W_{24}$, $W_{41}$ correspondingly to the weak bits Bit_1,2, Bit_2,4, Bit_4,1, in accordance with the weakness levels of the weak bits. For example, $W_{12} > W_{24} > W_{41}$. Similarly, the processor 222 is configured to assign different weights $W_{1'2}$, $W_{2'3}$, $W_{11'}$, $W_{32'}$ correspondingly to the weak bits Bit_1_',2, Bit_2',3, Bit_1,1', Bit_3,2', in accordance with the weakness levels of these weak bits. In at least one embodiment, the processor 222 is configured to use the same criteria and/or algorithm to assign weights to weak bits in the memory array 304 and in the redundant rows 306, redundant columns 308. The weak bits Bit_1,2, Bit_2,4, Bit_4,1, Bit_1,2, Bit_2',3, Bit_1,1', Bit_3,2' are schematically indicated by the corresponding weights $W_{12}$, $W_{24}$, $W_{41}$, $W_{1'2}$, $W_{2'3}$, $W_{11'}$, $W_{32'}$ in FIGS. 3B-3E.

FIG. 3E schematically shows a fail bit pattern including the fail bits Bit_1,1, Bit_3,3, Bit_3,4, Bit_4,3, and a weak bit pattern including the weak bits Bit_1,2, Bit_2,4, Bit_4,1, Bit_1',2, Bit_2',3, Bit_1,1', Bit_3,2'. In some embodiments, the test results output by the testing circuitry 212 and/or recorded in the test result storage 214 include the errors for each run of the memory test, as schematically shown in FIGS. 3A-3D. The processor 222 is configured to extract, from the test results in FIGS. 3A-3D, the fail bit pattern and/or the weak bit pattern as shown in FIG. 3E. A fail bit pattern, or a weak bit pattern, comprises a location of at least one fail bit, or at least one weak bit, in a memory block. In at least one embodiment, a fail bit pattern, or a weak bit pattern, is represented by locations $(x_i, y_j)$, $(x'_i, y_j)$, $(x_i, y'_{j'})$ of all fail bits, or all weak bits, in the memory block. For example, the fail bit pattern in FIG. 3E is represented by locations $(x_1, y_1)$, $(x_3, y_3)$, $(x_3, y_4)$, $(x_4, y_3)$ of all fail bits Bit_1,1, Bit_3,3, Bit_3,4, Bit_4,3, and the weak bit pattern in FIG. 3E is represented by locations $(x_1, y_2)$, $(x_2, y_4)$, $(x_4, y_1)$, $(x'_1, y_2)$, $(x'_2, y_3)$, $(x_1, y'_{1'})$, $(x_3, y'_{2'})$, of all weak bits Bit_1,2, Bit_2,4, Bit_4,1, Bit_1',2, Bit_2',3, Bit_1,1', Bit_3, 2'.

Figure 4:
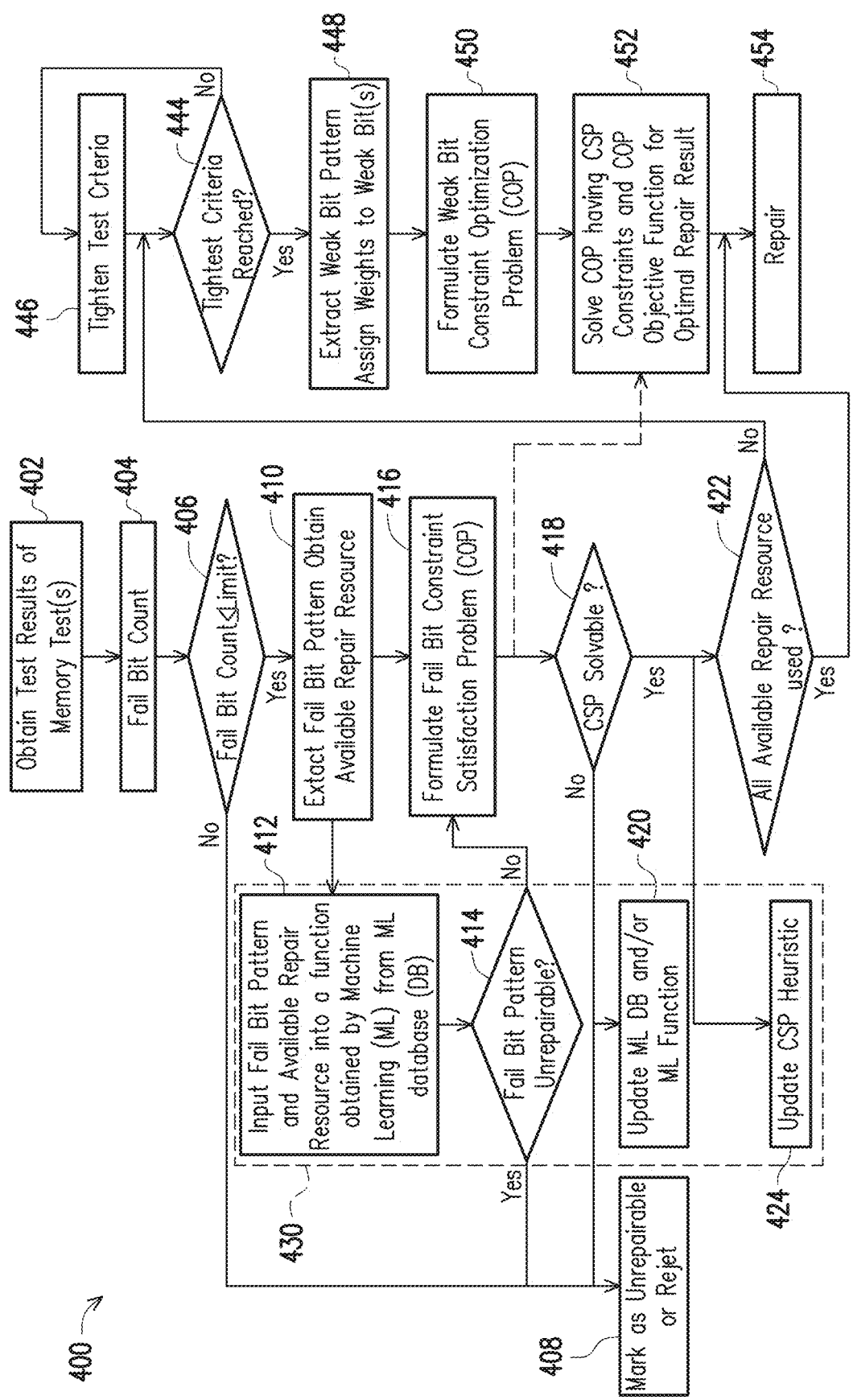
FIG. 4 is a flow chart of a method of repairing a memory, in accordance with some embodiments.

FIG. 4 is a flow chart of a method 400 of repairing a memory, in accordance with some embodiments. In at least one embodiment, the memory to be repaired corresponds to the memory 100. In some embodiments detailed in the following description, the method 400 is performed to repair a memory block in the memory, and other memory blocks of the memory are similarly repaired. In at least one embodiment, the memory block to be repaired corresponds to the memory block 300. In one or more embodiments, the method 400 is performed in the system 200. In some embodiments, the method 400 is executed at least partially by a processor, such as the processor 222.

At operation 402, test results of at least one memory test are obtained. For example, as described with respect to FIG. 2, at least one memory test is performed by the testing circuitry 212 and the test results are recorded in the test result storage 214 for access by, or transmission to, the processor 222. In at least one embodiment, all memory tests to be done on the memory block are performed first, and complete test results are provided to the processor 222 at the beginning of the method 400. In at least one embodiment, memory tests to be done are performed concurrently with, or in response to, one or more operations in the method 400.

At operation 404, a number of fail bits (also referred to as "fail bit count") in the memory block is obtained from the test results of the at least one memory test. For example, based on the test results of several runs of at least one memory test, the processor 222 is configured to identify fail bits and the number of fail bits in the memory block 300, as described with respect to FIGS. 3A-3D. In at least one embodiment, the number of fail bits includes fail bits in the memory array 304, but does not include fail bits in the redundant rows 306, redundant columns 308. In the examples in FIGS. 3A-3D, the number of fail bits in the memory block 300 is 4.

At operation 406, it is determined whether the number of fail bits in the memory block is lower than or equal to a predetermined threshold. In response to a negative determination (No from 406), the process proceeds to operation 408. In response to a positive determination (Yes from 406), the process proceeds to operation 410. For example, the processor 222 compares the number of fail bits obtained at operation 404 with a predetermined threshold. The predetermined threshold is an acceptable maximum number of fail bits in a memory block, beyond which a quality of the memory or the memory block is considered insufficient. In some embodiments, the acceptable maximum number of fail bits depends on the target yield of the manufacturing processes used to fabricate the memory. For example, where the manufacturing processes have higher target yield, the acceptable maximum number of fail bits is lower, and where the manufacturing processes have lower target yield, the acceptable maximum number of fail bits is higher. In at least one embodiment, the acceptable maximum number of fail bits in a memory block depends on the size of the memory block. For example, a larger memory block has a higher acceptable maximum number of fail bits. In some embodiments, the acceptable maximum number of fail bits also depends on the allocable repair resources of the memory block. For example, a memory block with greater allocable repair resources has a higher acceptable maximum number of fail bits.

At operation 408, in response to a determination at operation 406 that the number of fail bits in the memory block is higher than the predetermined threshold, the memory block is marked as unrepairable or the memory as a whole is rejected. In at least one embodiment, the processor 222 is configured to control the memory testing device 210 to mark the memory block as unrepairable or to reject the memory. In some embodiments, marking the memory block unrepairable comprises recording in the repair register 110 that the memory block with the number of fail bits higher than the predetermined threshold is unrepairable, and then proceeding to repair another memory block in the memory. It is possible in at least one embodiment to use a memory with one or more unrepairable memory blocks in applications or devices that do not require high memory quality. However, when a number of unrepairable memory blocks in a memory is higher than an acceptable limit, the memory is considered defective and physically discarded. In some embodiments, rejecting the memory comprises causing or instructing the rejected memory to be physically discarded, without attempting to repair another memory block. For simplicity, operation 408 is also referred to herein as "rejection decision."

In at least one embodiment, for checking the number of fail bits in the memory block at operation 406 and a potential early rejection decision at operation 408, it is not necessary to perform all memory tests planned to be done on the memory block. Instead, a limited number of memory tests, or limited runs of the same memory test, are sufficient to identify fail bits and the number of fail bits in the memory block with a subsequent potential early rejection decision. By checking the number of fail bits in the memory block early without waiting for all the memory tests to be done, it is possible in some embodiments to save time and/or resources on unnecessarily testing and/or attempting to repair a memory block with an excessive number of fail bits.

At operation 410, in response to a determination at operation 406 that the number of fail bits in the memory block is not higher than the predetermined threshold, a fail bit pattern of the fail bits is extracted from the test results of at least one memory test, and the available repair resource allocable for repairing the memory block is obtained. In at least one embodiment, a fail bit pattern comprises the location of at least one fail bit to be repaired in the memory block. For example, as described with respect to the example in FIG. 3E, the fail bit pattern including locations of fail bits Bit_1,1, Bit_3,3, Bit_3,4, Bit_4,3, is extracted, by the processor 222, from the test results described with respect to the examples in FIGS. 3A-3D.

The repair resource allocable for repairing the memory block comprises the number of redundant word lines and the number of redundant bit lines assigned to, or included in, the memory block, as described with respect to FIG. 1B or 3A. However, there is a situation where the repair resource assigned to or included in the memory block is not entirely available for repairing the memory block. For example, it is possible that a redundant word line or a redundant bit line assigned to the memory block has one or more errors therein that prevent the redundant word line or redundant bit line from being reliably usable for repairing the memory block. Such errors in the redundant word lines or redundant bit lines are discoverable though the at least one memory test which, as described herein, is applied to test both a memory array and repair resources in a memory block. By removing, e.g., using the processor 222, any redundant word line or redundant bit line that has an error from the numbers of redundant word lines and redundant bit lines assigned to the memory block, numbers of redundant word lines and/or redundant bit lines that are actually available for repairing the memory block is/are obtained. The numbers of redundant word lines and/or redundant bit lines actually available for repairing the memory block are referred to herein as the available repair resource. In some embodiments, a redundant word line or redundant bit line with a fail bit is removed from the available repair resource. In one or more embodiments, the presence of one or more weak bits in a redundant word line or redundant bit line does not cause the redundant word line or redundant bit line to be removed from the available repair resource. For example, as shown in FIG. 3E, the redundant word lines $x'_1$, $x'_2$, and the redundant bit lines are $y'_1$, $y'_2$ have weak bits, but are still included in the available repair resource. However, the presence of a weak bit with a higher weight (lower quality) in a redundant word line or redundant bit line indicates that the redundant word line or redundant bit line has a lower quality than another redundant word line or redundant bit line having no weak bit or having a weak bit with a lower weight (higher quality). In some embodiments, a redundant word line or redundant bit line having higher quality is preferentially allocated for repair over a redundant word line or redundant bit line having lower quality. In at least one embodiment, obtaining the available repair resource allocable for repairing the memory block and/or determining the presence and/or quality of one or more weak bits in the available repair resource give a consideration to the quality of the repair resource, which improves the accuracy of further operations described herein. In some embodiments, the process proceeds from operation 410 to operation 412. For example, the process proceeds from operation 410 to operation 412 when machine learning is implemented, as described herein. In some embodiments, the process proceeds from operation 410 to operation 416. For example, the process proceeds from operation 410 to operation 416 when machine learning is not implemented, as described herein.

At operation 412, the extracted fail bit pattern and available repair resource are input into a function obtained by machine learning (ML) to check whether the fail bit pattern is unrepairable. In at least one embodiment, this function corresponds to the ML function 232 which is obtained by machine learning performed on data stored in the ML database 230. The data in the ML database 230 comprise a large number of unrepairable bit patterns and corresponding available repair resources. Each of the unrepairable bit patterns was previously determined or labeled to be unrepairable given the corresponding available repair resource. In some embodiments, the data in the ML database 230 are collected from unsolvable CSPs in a data collection process performed by the method 400 as described herein. In at least one embodiment, at least a portion of the data in the ML database 230 is provided from other sources, such as training data generated and/or labeled automatically and/or by human experts. In some embodiments, there are two main phases in the machine learning, namely, a learning phase, and an implementing phase.

In the learning phase, machine learning is performed, by the processor 222 or another processor, to learn, from the large amount of data in the ML database 230, one or more distinctive features of the unrepairable bit patterns and/or one or more correlations between the unrepairable bit patterns and the corresponding available repair resources which were previously determined to be insufficient for successful repair of the unrepairable bit patterns. The result of the learning phase comprises the ML function 232. In some embodiments, the machine learning comprises supervised learning. Other machine learning techniques are within the scopes of various embodiments, and include, but are not limited to, unsupervised learning, semi-supervised learning, reinforcement learning, Q-learning, deep learning, or the like. In at least one embodiment, the machine learning is implemented in a neural network.

In the implementing phase, which is at operation 412, the ML function 232 is executed, e.g., by the processor 222, to check whether the fail bit pattern extracted at operation 410 is unrepairable in view of the fail bit pattern itself and the corresponding available repair resource, both of which are input into the ML function 232. In at least one embodiment, the fail bit pattern input into the ML function 232 includes the size of the memory array, and locations of all fail bits in the memory array, as described with respect to FIG. 3E. The available repair resource input into the ML function 232 includes the numbers of redundant word lines and/or redundant bit lines actually available for repairing the memory block. Based on the input information, the ML function 232 outputs a determination whether the fail bit pattern is unrepairable or not, in consistence with the distinctive feature(s) and/or correlation(s) learned in the learning phase from the large amount of data in the ML database 230. The larger the amount of data in the ML database 230, the more accurate the determination of the ML function 232 about unrepairability of the input fail bit pattern.

At operation 414, a determination of the ML function 232 about unrepairability of the fail bit pattern extracted at operation 410 is considered. In response to a determination of the ML function 232 that the fail bit pattern is unrepairable (Yes from 414), the process proceeds to operation 408. In response to a determination of the ML function 232 that the fail bit pattern is not unrepairable (No from 414), the process proceeds to operation 416. In some embodiments, a negative determination at operation 414 (No from 414), means that the ML function 232 does not return a conclusive determination that the fail bit pattern is unrepairable. In at least one embodiment, operation 414 is performed by the processor 222.

In at least one embodiment, by using the ML function 232 for checking unrepairability of the extracted fail bit pattern at an early stage of the method 400, i.e., before attempting to solve a CSP as described with respect to operation 416, it is possible in some embodiments to save time and/or computing resources in an unnecessary attempt to repair an otherwise unrepairable fail bit pattern.

At operation 416, a CSP is formulated for the extracted fail bit pattern. The CSP contains a plurality of CSP constraints that a solution, if exists, must satisfy. The CSP constraints correspond to the locations of the fail bits in the memory block, and the available repair resource. In some embodiments, operation 416 is performed by the processor 222.

In at least one embodiment, the CSP comprises the following CSP constraints:

$$\Sigma_{i=1}^{m} x_i \geq m - x_{repair\ resource} \quad (1)$$

$$\Sigma_{j=1}^{n} y_j \geq n - y_{repair\ resource} \quad (2)$$

$$\Sigma_{k=1}^{h} (x_{i\_k} \cdot y_{j\_k}) = 0 \quad (3)$$

where m is a number of word lines in the memory block, n is a number of bit lines in the memory block, h is a number of fail bits to be repaired in the memory block, as identified by one or more memory tests, $x_{repair\ resource}$ is a number of redundant word lines available to repair the memory block (i.e., the number of redundant word lines without fail bits), $y_{repair\ resource}$ is a number of redundant bit lines available to repair the memory block (i.e., the number of redundant bit lines without fail bits), $x_i$ is either 0 or 1 and corresponds to an $i^{th}$ word line among the m word lines, $x_i=0$ corresponding to the $i^{th}$ word line being repaired (or replaced) by one of the redundant word lines, and $x_i=1$ corresponding to the $i^{th}$ word line not being repaired, $y_j$ is either 0 or 1 and corresponds to a $j^{th}$ bit line among the n bit lines, $y_j=0$ corresponding to the $j^{th}$ bit line being repaired (or replaced) by one of the redundant bit lines, and $y_j=1$ corresponding to the $j^{th}$ bit line not being repaired, $x_{i\_k}$ is $x_i$ corresponding to the word line coupled to a $k^{th}$ fail bit among the h fail bits, and $y_{j\_k}$ is $y_j$ corresponding to the bit line coupled to the $k^{th}$ fail bit.

The CSP constraint (1) means that the number of word lines being repaired (i.e., the number of $x_i$ being assigned with 0) cannot be higher than the number of available redundant word lines. The CSP constraint (2) means that the number of bit lines being repaired (i.e., the number of $y_j$ being assigned with 0) cannot be higher than the number of available redundant bit lines. The CSP constraint (3) means that all fail bits must be repaired, i.e., for every $k^{th}$ fail bit, at least one of $x_{i\_k}$ or $y_{j\_k}$ should be 0 (i.e., each fail bit must be repaired by either a redundant word line or a redundant bit line). The formulation of the CSP includes formulation of the CSP constraints. The described CSP constraints (1), (2), (3) are examples. Other CSP constraints are within the scopes of various embodiments.

A solution to the CSP includes a set of assignment of either 1 or 0 to each and every $x_i$ and $y_j$. The solution must also satisfy all CSP constraints, for example, the CSP constraints (1), (2), (3) described herein. The CSP being solvable (or satisfiable), i.e., having a solution (i.e., a complete and consistent assignment of either 1 or 0 to each and every $x_i$ and $y_j$), means that all fail bits in the memory array of the memory block are repairable by the available repair resource. The solution of the CSP is used, e.g., by the processor 222, to allocate the available repair resource to repair all fail bits in the memory array of the memory block and to generate the corresponding repair information to be recorded in the repair register 110. For example, for each $x_i=0$ in the solution, one of the available redundant word lines is allocated to repair the $i^{th}$ word line, and for each $y_j=0$ in the solution, one of the available redundant bit lines is allocated to repair the $j^{th}$ bit line.

In at least one embodiment, the CSP further comprises at least one CSP objective function to be optimized. Example CSP objective functions are as follows:

$$\text{maximizing } \Sigma_{i=1}^{m} x_i \text{ and } \Sigma_{j=1}^{n} y_j \quad (4).$$

A purpose of the at least one CSP objective function is to determine an optimal solution when there are multiple solutions to the CSP. For example, in one or more embodiments with the CSP objective functions (4), when the CSP has two or more solutions, the solution that achieves the maximum values of $\Sigma_{i=1}^{m} x_i$ and $\Sigma_{j=1}^{n} y_j$ (corresponding to the minimum total number of redundant word lines and/or redundant bit lines allocated to repair all fail bits) is selected as the final solution to be applied for actually repairing the fail bits in the memory array of the memory block. In other words, the solution of the CSP is optimized to minimize the amount of the available repair resource allocated to the repair of the fail bits. When none of the solutions of the CSP achieve maximum values for both $\Sigma_{i=1}^{m} x_i$ and $\Sigma_{j=1}^{n} y_j$, one or more further criteria are relied on to select the final solution, in some embodiments. Alternatively, in at least one embodiment, the final solution is randomly selected among the multiple solutions of the CSP. The described CSP objective functions (4) are examples. Other CSP objective functions are within the scopes of various embodiments. In at least one embodiment, CSP objective functions are omitted in the CSP.

Applying the CSP constraints (1), (2), (3) and the CSP objective functions (4) to the example in FIG. 3E where m=n=h=4, the following CSP constraints (1'), (2'), (3'), and CSP objective functions (4') are obtained for a CSP corresponding to the fail bit pattern of Bit_1,1, Bit_3,3, Bit_3,4, Bit_4,3:

$$\sum_{i=1}^{4} x_i \geq 4 - x_{repair\ resource} \quad (1')$$

$$\sum_{j=1}^{4} y_j \geq 4 - y_{repair\ resource} \quad (2')$$

$$(x_1 \cdot y_1) + (x_3 \cdot y_3) + (x_3 \cdot y_4) + (x_4 \cdot y_3) = 0 \quad (3')$$

$$\text{maximizing } \sum_{i=1}^{4} x_i \text{ and } \sum_{j=1}^{4} y_j \quad (4').$$

As can be seen from this specific example, the CSP constraints (1') and (2') correspond to the available repair resource in the memory block, and the CSP constraint (3') corresponds to the locations of the fail bits in the memory array of the memory block, i.e., corresponds to the fail bit pattern. In the example in FIG. 3E, $x_{repair\ resource}$=$y_{repair\ resource}$=2, i.e., the available repair resource includes two redundant word lines and two redundant bit lines. The CSP formulated at operation 416 is used at operations 418, 452, as described herein.

At operation 418, it is determined whether the CSP is solvable, i.e., whether the CSP has a solution. In response to a negative determination (No from 418), the process proceeds to operation 408 and operation 420, when machine learning is implemented. When machine learning is not implemented, the process proceeds to operation 408, without proceeding to operation 420, in response to a negative determination at operation 418. In response to a positive determination (Yes from 418), the process proceeds to operations 422 and 424, when machine learning is implemented. When machine learning is not implemented, the process proceeds to operation 422, without proceeding to operation 424, in response to a positive determination at operation 418. For example, in operation 418, the processor 222 is configured to search for a solution to the CSP among all possible combinations of assignment of either 0 or 1 to each and every $x_i$ and $y_j$, while trying to satisfy all CSP constraints of the CSP. In some embodiments, the processor 222 is configured to execute one or more search or solving algorithms (also referred to herein as "heuristics") to attempt to find a solution within a predetermined amount of time or number of iterations. In at least one embodiment, the predetermined amount of time or number of iterations is set to avoid unnecessarily or ineffectively prolonging the repair process. When a solution is found within the predetermined amount of time or number of iterations, the processor 222 determines that the CSP is solvable. When no solution is found within the predetermined amount of time or number of iterations, the processor 222 determines that the CSP is unsolvable. A determination that the CSP is unsolvable is considered to correspond to a determination that the fail bit pattern is unrepairable, despite an earlier determination by the ML function 232 at operations 412, 414 that the fail bit pattern is not unrepairable.

At operation 420, in response to a determination at operation 418 that the CSP is unsolvable, i.e., the fail bit pattern is unrepairable, the ML database 230 containing the data for machine learning is updated. For example, the processor 222 is configured to cause the fail bit pattern, now determined as unrepairable, to be added with the corresponding available repair resource to the ML database 230. In at least one embodiment, the ML function 232 is updated, retrained, or relearned, by machine learning from the data in the updated ML database 230. In some embodiments, the ML function 232 is updated periodically. In some embodiments, the ML function 232 is updated as soon as new data from an unsolvable CSP is added to the ML database 230. In one or more embodiments, the ML database 230 is updated with data supplied from multiple memory testing and repairing systems similar to the system 200.

In some embodiments, operation 420 corresponds to a data collection process for the learning phase of machine learning. Specifically, at the beginning when the system 200 is deployed for the first time, there is no data or there is an insufficient amount of data of unrepairable bit patterns and corresponding available repair resources in the ML database 230. Machine learning from such an insufficient amount of data potentially results in an inaccurate ML function. Therefore, machine learning is not yet performed and/or an ML function is not yet available or usable. In such a situation, operations 412, 414 related to usage of an ML function are temporarily omitted, in accordance with some embodiments, and the process proceeds from operation 410 to operation 416. At subsequent operation 418 which determines that a fail bit pattern is unrepairable (because a corresponding CSP is unsolvable), the process proceeds to operation 420 to add the unrepairable fail bit pattern together with the corresponding available repair resource to the ML database 230. In one or more embodiments, the ML database 230 is updated with data supplied from multiple memory testing and repairing systems similar to the system 200. As a result, data for machine learning are collected or built up in the ML database 230. When an amount of the collected data of unrepairable fail bit patterns and corresponding available repair resources in the ML database 230 becomes sufficient for accurate machine learning, the processor 222 or another processor is configured to perform machine learning to generate the ML function 232. Then, operations 412, 414 are performed and the ML database 230 and/or the ML function 232 is/are updated at operation 420 as described herein.

At operation 422, in response to a determination at operation 418 that the CSP is solvable and has a solution, it is determined whether all of the available repair resource has been allocated to repair the fail bits in the memory array of the memory block (i.e., whether any remaining repair resource exists). In response to a positive determination (Yes from 422), the process proceeds to operation 454. In response to a negative determination (No from 422), the process proceeds to operation 444. A remaining repair resource is any available repair resource remaining after a part of the available repair resource has been allocated for repairing the fail bits in accordance with the solution of the CSP. In some embodiments, the remaining repair resource comprises the number of available redundant word lines and the number of available redundant bit lines not allocated for repairing the fail bits in accordance with the solution to the CSP. In the example of FIG. 3E, the available repair resource comprises two available redundant word lines and two available redundant bit lines. Assuming that the solution to the CSP indicates that two available redundant word lines and one available redundant bit line are to be allocated for repairing the fail bits, the remaining repair resource comprises the remaining one available redundant bit line which is not allocated for repairing the fail bits. When at least one available redundant word line or at least one available redundant bit line remains unallocated, it is determined, e.g., by the processor 222, that a remaining repair resource exists, and the process proceeds to operation 444. When none of the available redundant word lines and available redundant bit lines remain unallocated, i.e., when all of the available repair resource has been allocated for repairing the fail bits, it is determined, e.g., by the processor 222, that no remaining repair resource exists, and the process proceeds to operation 454 where the solution of the CSP is accepted to allocate the available repair resource to repair all fail bits. For example, the processor 222 is configured to allocate all of the available repair resource to repair the word line and/or bit line corresponding to $x_i$ and/or $y_j$ being assigned with 0 in the solution of the CSP. The processor 222 is further configured to generate repair information to be recorded in the repair register 110, as described herein. The repairing process for the current memory block is then determined as being finished.

At operation 424, a heuristic for solving the CSP is updated. As described herein, the processor 222 is configured to execute a search algorithm (or heuristic) to attempt to find a solution of a CSP within a predetermined amount of time or number of iterations. When no solution is found within the predetermined amount of time or number of iterations, the processor 222 determines that the CSP is not solvable. In some situations, it is possible that the processor 222 determines the CSP as unsolvable, even though a solution actually exists. A possible reason is that the solution could not be found within the predetermined amount of time or number of iterations due to the executed search algorithm (or heuristic). It is, therefore, a consideration in at least one embodiment to select and/or optimize a heuristic, among a plurality of available heuristics, to shorten the amount of time or reduce the number of iterations required to find a solution, if indeed exists. Such heuristic selection and/or optimization is referred to herein as heuristic updating. Example available heuristics for heuristic selection include, but are not limited to, a depth-first search backtracking algorithm, one or more variable selection and/or ordering heuristics, impact dynamic variable-value selection heuristic, or the like.

In some embodiments, the heuristic updating at operation 424 involves a further machine learning process separate from the machine learning process described herein with respect to operations 412, 414, 420. For example, every time a CSP is solved, indicating that the used heuristic is effective, information related to the effective heuristic is added to a database. In some embodiments, information related to effective heuristics is supplied from multiple memory testing and repairing systems to increase the speed and/or amount of data collection. Based on the collected data on effective heuristics, machine learning, such as supervised machine learning, is performed to select an optimal heuristic among the plurality of available heuristics. In some embodiments, an objective of machine learning is to achieve quick convergence toward an optimal heuristic. In at least one embodiment, an optimal heuristic is a hybrid heuristic in which a first heuristic among the available heuristics is executed in a first half of the CSP solution search process, and then the first heuristic is switched to a second heuristic in a second half of the search process. Other configurations are within the scopes of various embodiments.

In FIG. 4, operations related to machine learning in one or more embodiments, such as operations 412, 414, 420, 424 are schematically grouped and indicated at 430.

In some embodiments, as described with respect to operations 418, 422, upon a determination that the CSP is solvable and has a solution, meaning that all fail bits in the memory array of the memory block are repairable by the available repair resource, a next consideration is to attempt to use any and/or all remaining repair resource to repair weak bits in the memory array of the memory block as many, and/or as effectively, as possible. In at least one embodiment, a decision how to allocate any and/or all remaining repair resource to repair weak bits is made by solving a COP together with the CSP. FIG. 4 schematically illustrates an example process flow for repairing weak bits by solving a COP together with the CSP. Other process flows are within the scopes of various embodiments.

At operation 444, upon a negative determination at operation 422 (No from 422), meaning that all fail bits in the memory array of the memory block are repairable by the available repair resource and there is still an available repair resource remaining for repairing weak bits the memory array, it is determined whether the tightest test criteria (or the strictest test conditions) have been reached. In response to a negative determination (No from 444), the process proceeds to operation 446. In response to a positive determination (Yes from 444), the process proceeds to operation 448.

At operation 446, in response to a determination that the tightest test criteria have not been reached at operation 444, the test criteria are tightened, at least one memory test is performed at the tightened test criteria, the test results are recorded, and then the process returns to operation 444. Examples of test criteria, test criteria tightening, tightest test criteria, and test results are described with respect to FIGS. 3A-3D. Other arrangements are within the scopes of various embodiments. In at least one embodiment, operations 444, 446 are performed to collect test results for identifying weak bits.

In the example process flow in FIG. 4, one or more memory tests and/or one or more runs of a memory test for identifying weak bits are not performed until it has been determined that all fail bits are repairable. As a result, it is possible in at least one embodiment to save time and/or resources on unnecessarily testing for weak bits in a memory block that is unrepairable due to fail bits.

In some embodiments, memory tests and/or one or more runs of a memory test for identifying weak bits are performed regardless of a determination whether the memory block is repairable. For example, all memory tests to be done on the memory or the memory block are performed in advance, and the test results including those for identifying weak bits are provided at operation 402. In such embodiments, operations 444, 446 are performed before operation 402, for example, by the testing circuitry 212. Other arrangements where one or more iterations of operations 444, 446 is/are performed concurrently with one or more other operations in the method 400 are within the scopes of various embodiments.

At operation 448, in response to a determination at operation 444 that the tightest test criteria have been reached, meaning test results for identifying weak bits have been collected, a weak bit pattern of the weak bits in the memory block is extracted from the test results. In at least one embodiment, a weak bit pattern comprises the location of at least one weak bit in the memory block. For example, as described with respect to the example in FIG. 3E, the weak bit pattern including locations of not only weak bits Bit_1,2, Bit_2,4, Bit_4,1 in the memory array 304 but also weak bits Bit_1',2, Bit_2',3, Bit_1,1', Bit_3,2' in the redundant rows 306, redundant columns 308, is extracted, by the processor 222, from the test results described with respect to the examples in FIGS. 3A-3D. In some embodiments, operation 448 further comprises assigning, e.g., by the processor 222, various weights to the weak bits in accordance with the weakness levels of the weak bits, as described with respect to FIGS. 3B-3E. In at least one embodiment where, for example, test results for identifying weak bits have been collected earlier, operation 448 is performed in response to a positive determination at operation 418 (Yes from 418).

At operation 450, a COP is formulated for the extracted weak bit pattern. The COP contains a plurality of COP constraints being the same as the CSP constraints, and also comprises a COP objective function that a solution should optimize. The COP constraints being the same as the CSP constraints correspond to the guaranteed satisfaction of the CSP for a complete repair of all fail bits. In at least one embodiment, because the COP constraints are the same as the CSP constraints, operation 450 simply includes formulating at least one COP objective function. In some embodiments, operation 450 is performed by the processor 222.

At operation 452, the COP formulated at operation 450 is solved. Because the COP constraints are the same as the CSP constraints, operation 450 includes solving the CSP constraints together with the at least one COP objective function. For example, the CSP constraints being parts of the CSP formulated at operation 416 are provided to be used at operation 452, as illustrated in FIG. 4. In solving the COP, a solution is sought to satisfy all of the CSP constraints, while optimizing the at least one COP objective function. In some embodiments, operation 452 is performed by the processor 222.

In at least one embodiment, the COP comprises the following COP constraints which are the same as the CSP constraints described herein, i.e., $$\Sigma_{i=1}^{m} x_i \geq m - x_{repair\ resource} \quad (1)$$

$$\Sigma_{j=1}^{n} y_j \geq n - y_{repair\ resource} \quad (2)$$

$$\Sigma_{k=1}^{h}(x_{i\_k} \cdot y_{j\_k}) = 0 \quad (3)$$

The COP further comprises at least one COP objective function to be optimized, for determining an optimal solution to the COP. In at least one embodiment, the at least one COP objective function corresponds to at least one of the location of or the weight assigned to at least one weak bit in the memory block. An example COP objective function for the COP is as follows:

$$\text{minimizing } \Sigma_{l=1}^{s} W_l (x_l \cdot y_l) \quad (5)$$

where s is a number of weak bits in the memory block including the memory array, redundant rows and redundant columns, $x_l$ is $x_i$ or $x'_i$, corresponding to the word line or redundant word line coupled to an $l^{th}$ weak bit among the s weak bits, each of $x_i$ and $x'_i$ being either 0 or 1, $x_i=0$ corresponding to the $i^{th}$ word line being repaired (or replaced) by a redundant word line, $x_i=1$ corresponding to the $i^{th}$ word line not being repaired, $x'_i=0$ corresponding to the $i^{th}$ redundant word line not being used to repair a word line, and $x'_i=1$ corresponding to the $i^{th}$ redundant word line being used to repair a word line, $y_l$ is $y_j$ or $y'_j$, corresponding to the bit line or redundant bit line coupled to the $l^{th}$ weak bit, each of $y_j$ and $y'_j$ being either 0 or 1, $y_j=0$ corresponding to the $j^{th}$ bit line being repaired (or replaced) by a redundant bit line, $y_j=1$ corresponding to the $j^{th}$ bit line not being repaired, $y'_j=0$ corresponding to the $j^{th}$ redundant bit line not being used to repair a bit line, and $y'_j=1$ corresponding to the $j^{th}$ redundant bit line being used to repair a bit line, and $W_l$ is the weight assigned to the $l^{th}$ weak bit.

The described COP objective function (5) is an example. Other COP objective functions are within the scopes of various embodiments.

Applying the CSP constraints (1), (2), (3) and the COP objective function (5) to the example in FIG. 3E where m=n=4, m'=n'=2, and s=7, the following CSP constraints (1'), (2'), (3') and COP objective function (5') are obtained for a COP corresponding to the weak bit pattern including weak bits Bit_1,2, Bit_2,4, Bit_4,1, Bit_1',2, Bit_2',3, Bit_1,1', Bit_3,2':

$$\Sigma_{i=1}^{4} x_i \geq 4 - x_{repair\ resource} \quad (1')$$

$$\Sigma_{j=1}^{4} y_j \geq 4 - y_{repair\ resource} \quad (2')$$

$$(x_1 \cdot y_1) + (x_3 \cdot y_3) + (x_3 \cdot y_4) + (x_4 \cdot y_3) = 0 \quad (3')$$

$$\text{minimizing } W_{12}(x_1 \cdot y_2) + W_{24}(x_2 \cdot y_4) + W_{41}(x_4 \cdot y_1) + W_{1'2}(x'_1 \cdot y_2) + W_{2'3}(x'_2 \cdot y_3) + W_{11'}(x_1 \cdot y'_1) + W_{32'}(x_3 \cdot y'_2) \quad (5')$$

As can be seen from this specific example, the CSP constraint (1'), (2'), (3') must be satisfied to ensure a guaranteed repair of all fail bits in the memory array, whereas the COP objective function (5') is optimized, i.e., minimized, based on the locations and weights of the weak bits in the memory block, to obtain an optimal repair of one or more weak bits as described herein.

A solution to the COP includes a set of assignment of either 1 or 0 to each and every $x_i$, $y_j$, $x'_i$, and $y'_j$, and must satisfy all of the CSP constraints while optimizing the at least one COP objective function. A purpose of the at least one COP objective function is to determine an optimal solution (corresponding to an optimal repair of one or more weak bits) when there are multiple solutions that satisfy all CSP constraints. For example, in one or more embodiments with the COP objective function (5), it is possible to minimize the COP objective function (5) when at least one of $x_l$ or $y_l$ corresponding to an $l^{th}$ weak bit having the largest weight $W_l$ is assigned with 0. In at least one embodiment, the weak bit with the largest weight has the higher weakness level or the lowest quality, and is the weakest bit. When the weakest bit corresponds to a functional memory cell to be repaired, assigning 0 to $x_l$ or $y_l$ corresponding to the weakest bit means that it is possible to repair the functional memory cell with the lowest quality. When the weakest bit corresponds to a redundant memory cell, assigning 0 to $x_l$ or $y_l$ corresponding to the weakest bit means that it is possible to avoid using the redundant word line or redundant bit line with the lowest quality for repair. In some embodiments, minimizing the COP objective function (5) corresponds to allocating the remaining repair resource to repair the redundant memory cell with the lowest quality first, then a redundant memory cell with the second lowest quality, and so on until all of the remaining repair resource has been allocated, while attempting to avoid allocating the redundant word line or redundant bit line with the lowest quality before allocating a redundant word line or redundant bit line with higher quality. In other words, the solution to the COP is optimized based on the weights of the weak bits to preferentially repair a functional memory cell corresponding to a weak bit with a higher weight (lower quality) over another functional memory cell corresponding to a weak bit with a lower weight (higher quality), and/or to preferentially allocate a redundant word line or redundant bit line with higher quality over another redundant word line or redundant bit line with lower quality. When multiple solutions of the COP achieve the same minimum value of the objective function (5), one or more further criteria are relied on to select a final solution, in some embodiments. Alternatively, in at least one embodiment, the final solution is randomly selected among the multiple solutions of the COP. In at least one embodiment, one or more CSP objective functions being parts of the CSP formulated at operation 416, e.g., the CSP objective functions (4), are included as one or more COP objective functions to be optimized at operation 452.

In at least one embodiment, the COP is solved, e.g., by using a heuristic as described herein, independently of one or more CSP solutions to the CSP obtained at operation 418.

In some embodiments, the COP is solved by accepting one or more CSP solutions to the CSP obtained at operation 418 as parts of one or more potential COP solutions to the COP, and then searching among the potential COP solutions for an optimal COP solution that optimizes the at least one COP objective function. More specifically, a CSP solution of the CSP includes a set of assignment of either 1 or 0 to each and every $x_i$ and $y_j$, whereas a COP solution of the COP includes a set of assignment of either 1 or 0 to each and every $x_i$, $y_j$, $x'_i$, and $y'_j$. In other words, a CSP solution can be a subset of a potential COP solution. When a CSP solution is included as a part of a potential COP solution, all $x_i$ and $y_j$ that have been assigned with 0 in the CSP solution remain assigned with 0 in the potential COP solution. The potential COP solution is thus guaranteed to satisfy all of the CSP constraints. The optimization of the at least one COP objective function is then performed among all $x'_i$, and $y'_j$, as well as those $x_i$ and/or $y_j$ that have not been assigned with 0 in the CSP solution. As a result, in at least one embodiment, the amount of calculations and/or time for optimizing the at least one COP objective function is reduced comparted to when the COP is solved independently of one or more CSP solutions obtained at operation 418.

At operation 454, the optimal COP solution obtained at operation 452 is accepted to allocate the available repair resource to repair all fail bits in the memory array, and also to repair one or more weak bits in the memory array with the priority being given to the weak bits with the higher weights (or lower quality). For example, the processor 222 is configured to allocate the available repair resource, i.e., one or more redundant word lines and/or redundant bit lines corresponding to $x'_i$, and/or $y'_j$, being assigned with 0 in the optimal COP solution, to repair the word line and/or bit line corresponding to $x_i$ and/or $y_j$ being assigned with 0 in the optimal COP solution. In some embodiments, in accordance with the optimal COP solution, the processor 222 is configured to repair, if possible, one or more weak bits using the available repair resource already allocated for repairing one or more fail bits. For example, referring to FIG. 3E, it is possible to allocate a redundant word line to repair the fail bit Bit_1,1, and the weak bit Bit_1,2 coupled to the same word line $x_1$ as Bit_1,1. It is possible that one or more weak bits in the memory array remain unrepaired. For example, if no redundant word lines and no redundant bit lines are available or allocable to repair the weak bit Bit_2,4, the weak bit Bit_2,4 remains unrepaired. The processor 222 is further configured to generate repair information to be recorded in the repair register 110, as described herein. The repairing process for the current memory block is then determined as being finished.

In at least one embodiment, a heuristic update similar to operation 424 is applicable to improve the optimization process of solving the COP at operation 452.

In some embodiments, quality of the repair resource is a consideration in memory repair. For example, as described herein, the available repair resource allocable for repairing a memory block is determined from the repair resource allocated to the memory block. Further, the quality of the repair resource actually allocable for memory repair is considered, e.g., by identifying the presence of one or more fail bits and/or weak bits in the repair resource allocated to the memory block and/or by taking into consideration the quality (or weakness level) of the one or more weak bits in the repair resource allocated to the memory block. As a result, it is possible to increase repair yield and/or repair quality, in one or more embodiments. Compared to other approaches where repair resource quality is given no or little consideration with repair yield of about 35%, some embodiments with repair resource quality consideration make it possible to increase repair yield to about 88%. In at least one embodiment, the repair resource usage is also increased compared to other approaches.

Memory repair involves determining how to allocate repair resources to repair one or more bits in a memory or memory block. In some embodiments, an adaptive memory repair approach is provided by formulating a repair resource allocation problem as Constraint Programing (CP) problems. The CP problems include a Constraint Satisfaction Problem (CSP) for repair resource allocation to repair fail bits, and a Constraint Optimization Problem (COP) for repair resource allocation to repair weak bits. Both the CSP and the COP are formulated based on test results, one or more repair resource deployment rules, and repair resource quality. The COP comprises the CSP constraints of the CSP. The COP further contains a COP objective function formulated based on weights assigned to weak bits according to their weakness levels. An attempt to solve the CSP provides an answer to a yes-or-no question: whether there exists at least one solution that satisfies all CSP constraints, i.e., whether a fail bit pattern of the fail bits in the memory array of the memory block is repairable. When there is no solution to the CSP, an early rejection decision is reached. When there is a solution to the CSP, the CSP solution defines how the available repair resource is to be allocated for repairing all fail bits in the memory array. When all of the available repair resource has not been used for repairing all fail bits in the memory array, an attempt is made to solve the COP. Solving the COP is focused on finding the best or optimal COP solution which defines the optimal manner for allocating the available repair resource for repairing, in addition to all fail bits in the memory array, one or more of the weak bits in the memory array. In solving the COP, priority is given to repairing those weak bits with the lowest quality first and/or priority is given to using those redundant word lines and/or redundant bit lines with the highest quality first. As a result, in at least one embodiment, an early rejection decision is made, or the adaptive memory repair makes sure that all fail bits in the memory array are repaired while the weak bits in the memory array are repaired as much, or as effectively, as the available repair resource permits.

In some embodiments, machine learning is applied to reach, where appropriate, an even earlier rejection decision and/or to optimize the search algorithms (heuristics) used for solving the CSP and/or the COP. As a result, in at least one embodiment, potential rejection decisions and/or decisions for repair resource allocation are further accelerated and/or improved in quality.

In some embodiments, at least one of the CSP or the COP is an online CSP or online COP configured to learn and adapt at least one solving strategy based on previous repair cases, so as to improve itself for various memory types and/or fail bit/weak bit characteristics. In one or more embodiments, the online CSP or online COP allows dynamic changing among various solving strategies during a repairing process, to improve the repairing speed and/or efficiency. This is, in at least one embodiment, is an improvement over an offline CSP or COP which tends to stick at one solving strategy from the beginning to the end of a repairing process.

Figure 5:
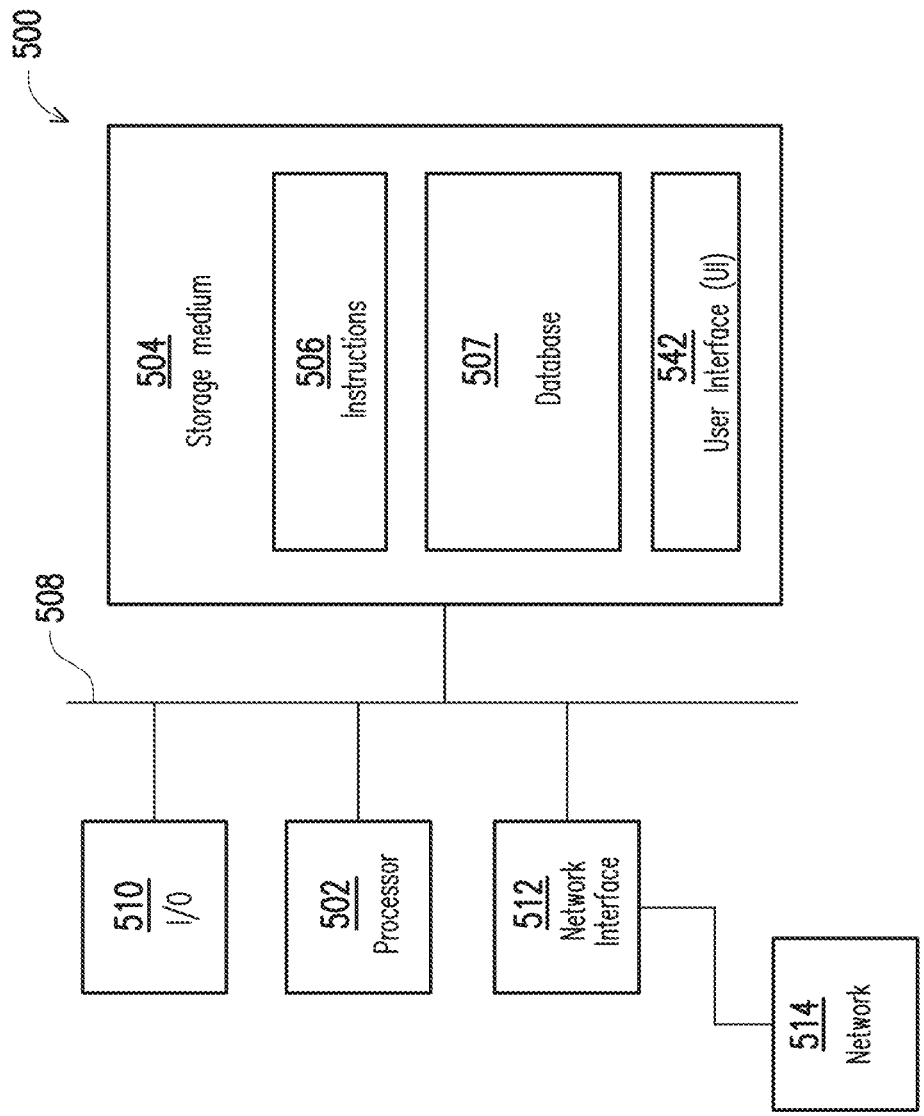
FIG. 5 is a block diagram of a hardware computing platform, in accordance with some embodiments.

FIG. 5 is a block diagram of a hardware computing platform 500, in accordance with some embodiments.

The hardware computing platform 500 comprises a hardware processor 502 and a non-transitory, computer-readable storage medium 504. Storage medium 504, amongst other things, is encoded with, i.e., stores, computer program code 506, i.e., a set of executable instructions. Execution of instructions 506 by hardware processor 502 causes hardware processor 502 to implement a portion or all of the methods and/or operations described herein in accordance with one or more embodiments.

Processor 502 is electrically coupled to computer-readable storage medium 504 via a bus 508. Processor 502 is also electrically coupled to an I/O interface 510 by bus 508. A network interface 512 is also electrically connected to processor 502 via bus 508. Network interface 512 is connected to a network 514, so that processor 502 and computer-readable storage medium 504 are capable of connecting to external elements via network 514. In one or more embodiments, processor 502 is a central processing unit (CPU), a multi-processor, a distributed processing system, an application specific integrated circuit (ASIC), and/or a suitable processing unit.

In one or more embodiments, computer-readable storage medium 504 is an electronic, magnetic, optical, electromagnetic, infrared, and/or a semiconductor system (or apparatus or device). For example, computer-readable storage medium 504 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 504 includes a compact disk-read only memory (CD-ROM), a compact disk-read/write (CD-R/W), and/or a digital video disc (DVD).

In one or more embodiments, storage medium 504 stores a database 507, such as an ML database as disclosed herein. In one or more embodiments, storage medium 504 stores an ML function as described herein.

The hardware computing platform 500 includes I/O interface 510. I/O interface 510 is coupled to external circuitry. In one or more embodiments, I/O interface 510 includes a keyboard, keypad, mouse, trackball, trackpad, touchscreen, and/or cursor direction keys for communicating information and commands to processor 502.

The hardware computing platform 500 also includes network interface 512 coupled to processor 502. Network interface 512 allows hardware computing platform 500 to communicate with network 514, to which one or more other computer systems are connected. Network interface 512 includes wireless network interfaces such as BLUETOOTH, WIFI, WIMAX, GPRS, or WCDMA; or wired network interfaces such as ETHERNET, USB, or IEEE-1364. In one or more embodiments, a portion or all of the methods and/or operations described herein is implemented in two or more hardware computing platforms 500.

The hardware computing platform 500 is configured to receive information through I/O interface 510. The information received through I/O interface 510 includes one or more of instructions, data, test results, repair information and/or other parameters for processing by processor 502. The information is transferred to processor 502 via bus 508. The hardware computing platform 500 is configured to receive information related to a UI through I/O interface 510. The information is stored in computer-readable medium 504 as user interface (UI) 542.

In some embodiments, a portion or all of the methods and/or operations described herein is implemented as a standalone software application for execution by a processor. In some embodiments, a portion or all of the methods and/or operations described herein is implemented as a software application that is a part of an additional software application. In some embodiments, a portion or all of the methods and/or operations described herein is implemented as a plug-in to a software application. In some embodiments, a portion or all of the methods and/or operations described herein is implemented as a software application that is used by the hardware computing platform 600.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, a method executed at least partially by a processor comprises extracting, from at least one memory test on a memory block of a memory, a location of at least one fail bit to be repaired in the memory block. The memory further comprises obtaining an available repair resource in the memory for repairing the memory block. The memory further comprises determining whether a Constraint Satisfaction Problem (CSP) containing a plurality of constraints is solvable. The plurality of constraints corresponds to the location of the at least one fail bit in the memory block, and the available repair resource. The memory further comprises, in response to said determining indicating that the CSP is not solvable, marking the memory block as unrepairable or rejecting the memory. The memory further comprises, in response to said determining indicating that the CSP is solvable and has a solution satisfying the plurality of constraints, repairing the at least one fail bit using the available repair resource in accordance with the solution of the CSP.

In some embodiments, a system comprises a memory testing device configured to perform at least one memory test on a memory block of a memory, and a processor coupled to the memory testing device. The processor is configured to extract, from the at least one memory test, a location of at least one fail bit to be repaired in the memory block, and to obtain an available repair resource in the memory for repairing the memory block. The processor is further configured to determine whether the at least one fail bit is unrepairable according to the location of the at least one fail bit in the memory block, the available repair resource, and a function obtained by machine learning from a database containing unrepairable bit patterns and corresponding available repair resources. In response to determining that the at least one fail bit is unrepairable, the processor is further configured to control the memory testing device to mark the memory block as unrepairable or to reject the memory.

In some embodiments, a computer program product comprises a non-transitory, computer-readable medium containing instructions therein. The instructions, when executed by a processor, cause the processor to extract, from at least one memory test on a memory block of a memory, a fail bit pattern of a plurality of fail bits to be repaired in the memory block, and a weak bit pattern of a plurality of weak bits in the memory block. The instructions further cause the processor to control marking the memory block as unrepairable or rejecting the memory, in response to any of a number of the plurality of fail bits is higher than a predetermined threshold, a machine learned function indicates, based on the fail bit pattern and an available repair resource in the memory for repairing the memory block, that the fail bit pattern is unrepairable, or a Constraint Satisfaction Problem (CSP) containing a plurality of constraints is not solvable, the plurality of constraints corresponding to the fail bit pattern and the available repair resource. The instructions further cause the processor to control repairing the memory based on either a solution of the CSP, the solution satisfying the plurality of constraints and indicating how the available repair resource is allocated in a repair of the plurality of fail bits, or a solution of a Constraint Optimization Problem (COP) containing the plurality of constraints and an objective function, the solution of the COP satisfying the plurality of constraints, optimizing the objective function, and indicating how the available repair resource is allocated in a repair of the plurality of fail bits and one or more weak bits among the plurality of weak bits.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, said method executed at least partially by a processor, comprising:
   extracting, from at least one memory test on a memory block of a memory, a location of at least one fail bit to be repaired in the memory block;
   obtaining an available repair resource in the memory for repairing the memory block;
   determining whether a Constraint Satisfaction Problem (CSP) containing a plurality of constraints is solvable, the plurality of constraints corresponding to
      the location of the at least one fail bit in the memory block, and
      the available repair resource;
   in response to said determining indicating that the CSP is not solvable, marking the memory block as unrepairable or rejecting the memory; and
   in response to said determining indicating that the CSP is solvable and has a plurality of solutions satisfying the plurality of constraints,
      selecting, among the plurality of solutions, a solution that optimizes at least one objective function contained in the CSP, and
      repairing the at least one fail bit using the available repair resource in accordance with the selected solution of the CSP.

2. The method of claim 1, wherein
the selected solution of the CSP corresponds to minimizing an amount of the available repair resource allocated to the repair of the fail bits.

3. The method of claim 1, wherein
the plurality of constraints of the CSP comprises:

$\Sigma_{i=1}^{m} x_i \geq m - x_{repair\ resource}$, $\Sigma_{j=1}^{n} y_j \geq n - y_{repair\ resource}$, and $\Sigma_{k=1}^{h} (x_{i\_k} y_{j\_k}) = 0$, where m is a number of word lines in the memory block,
n is a number of bit lines in the memory block,
h is a number of fail bits to be repaired in the memory block,
$x_{repair\ resource}$ is a number of redundant word lines available to repair the memory block,
$Y_{repair\ resource}$ is a number of redundant bit lines available to repair the memory block,
$x_i$ is either 0 or 1 and corresponds to an $i^{th}$ word line among the m word lines, $x_i = 0$ corresponding to the $i^{th}$ word line being repaired by one of the redundant word lines, and $x_i = 1$ corresponding to the $i^{th}$ word line not being repaired,
$y_j$ is either 0 or 1 and corresponds to a $j^{th}$ bit line among the n bit lines, $y_j = 0$ corresponding to the $j^{th}$ bit line being repaired by one of the redundant bit lines, and $y_j = 1$ corresponding to the $j^{th}$ bit line not being repaired,
$x_{i\_k}$ is $x_i$ corresponding to the word line coupled to a $k^{th}$ fail bit among the h fail bits, and
$y_{j\_k}$ is $y_j$ corresponding to the bit line coupled to the $k^{th}$ fail bit.

4. The method of claim 3, wherein
the CSP further contains maximizing $\Sigma_{i=1}^{m} x_i$ and $\Sigma_{j=1}^{n} y_j$.

5. The method of claim 1, further comprising:
   extracting, from the at least one memory test, a location of at least one weak bit in the memory block;
   in response to said determining indicating that the CSP is solvable, determining whether a remaining repair resource exists based on the available repair resource and the selected solution of the CSP;
   in response to a determination that the remaining repair resource exists, solving a Constraint Optimization Problem (COP) containing
      the plurality of constraints, and
      a further objective function to be optimized, the further objective function corresponding to the location of the at least one weak bit in the memory block; and
   repairing the at least one fail bit and the at least one weak bit using the available repair resource in accordance with a solution of the COP.

6. The method of claim 5, wherein the at least one weak bit comprises a plurality of weak bits, said method further comprising:
   assigning a plurality of weights correspondingly to the plurality of weak bits.

7. The method of claim 6, wherein
the plurality of constraints comprises:

$\Sigma_{i=1}^{m} x_i \geq m - x_{repair\ resource}$, $\Sigma_{j=1}^{n} y_j \geq n - y_{repair\ resource}$, and $\Sigma_{k=1}^{h} (x_{i\_k} y_{j\_k}) = 0$, and the further objective function comprises minimizing $\Sigma_{t=1}^{s} W_l(x_i \cdot y_l)$, where m is a number of word lines in the memory block, n is a number of bit lines in the memory block, h is a number of fail bits to be repaired in the memory block, s is a number of weak bits in the memory block, $X_{repair\ resource}$ is a number of redundant word lines available to repair the memory block, $Y_{repair\ resource}$ is a number of redundant bit lines available to repair the memory block, $x_i$ is either 0 or 1 and corresponds to an $i^{th}$ word line among the m word lines, $x_i=0$ corresponding to the $i^{th}$ word line being repaired by one of the redundant word lines, and $x_i=1$ corresponding to the $i^{th}$ word line not being repaired, $y_j$ is either 0 or 1 and corresponds to a $j^{th}$ bit line among the n bit lines, $y_j=0$ corresponding to the $j^{th}$ bit line being repaired by one of the redundant bit lines, and $y_j=1$ corresponding to the $j^{th}$ bit line not being repaired, $x'_{i'}$ is either 0 or 1 and corresponds to an $i'^{th}$ redundant word line, $x'_{i'}=1$ corresponding to the $i'^{th}$ redundant word line not being used to repair a word line, and $x'_{i'}=1$ corresponding to the $i'^{th}$ redundant word line being used to repair a word line, $y'_{j'}$ is either 0 or 1 and corresponds to a $j'^{th}$ redundant bit line, $y'_{j'}=0$ corresponding to the $j'^{th}$ redundant bit line not being used to repair a bit line, and $y'_{j'}=1$ corresponding to the $j'^{th}$ redundant bit line being used to repair a bit line, $x_j$ is $x_i$ or $x'_{i'}$ corresponding to the word line or redundant word line coupled to an $j^{th}$ weak bit among the s weak bits, $y_l$ is $y_j$ or $y'_{j'}$ corresponding to the bit line or redundant bit line coupled to the $j^{th}$ weak bit, and $W_l$ is the weight assigned to the $j^{th}$ weak bit.

8. The method of claim 1, further comprising:
checking whether the at least one fail bit is unrepairable according to
the location of the at least one fail bit in the memory block,
the available repair resource, and
a function obtained by machine learning from a database containing unrepairable bit patterns and corresponding available repair resources,
in response to said checking indicating that the at least one fail bit is unrepairable, marking the memory block as unrepairable or rejecting the memory; and
in response to said checking indicating that the at least one fail bit is not unrepairable, performing said determining whether the CSP is solvable.

9. The method of claim 8, further comprising:
in response to said determining indicating that the CSP is not solvable, adding the location of the at least one fail bit and the available repair resource to the database for updating the function.

10. The method of claim 1, further comprising:
in response to said determining indicating that the CSP is solvable, updating a heuristic of the CSP.

11. A system, comprising:
a memory testing device configured to perform at least one memory test on a memory block of a memory; and
a processor coupled to the memory testing device,
wherein the processor is configured to
extract, from the at least one memory test, a location of at least one fail bit to be repaired in the memory block,
obtain an available repair resource in the memory for repairing the memory block,
determine whether the at least one fail bit is unrepairable according to
the location of the at least one fail bit in the memory block,
the available repair resource, and
a function obtained by machine learning from a database containing unrepairable bit patterns and corresponding available repair resources, and
in response to determining that the at least one fail bit is unrepairable, control the memory testing device to mark the memory block as unrepairable or to reject the memory.

12. The system of claim 11, wherein the processor is further configured to
perform said machine learning to obtain the function from the database.

13. The system of claim 11, wherein the processor is further configured to, in response to determining that the at least one fail bit is not unrepairable,
determine whether a Constraint Satisfaction Problem (CSP) containing a plurality of constraints is solvable, the plurality of constraints corresponding to
the location of the at least one fail bit in the memory block, and
the available repair resource, and
in response to a determination that the CSP is not solvable,
control the memory testing device to mark the memory block as unrepairable or to reject the memory, and
update the database by adding the location of the at least one fail bit and the available repair resource to the database.

14. The system of claim 13, wherein the processor is further configured to
perform said machine learning to update the function based on the updated database.

15. The system of claim 13, wherein the processor is further configured to
extract, from the at least one memory test, a location of at least one weak bit in the memory block,
assign, based on the at least one memory test, a weight to the at least one weak bit,
in response to a determination that the CSP is solvable and has a solution satisfying the plurality of constraints, determine whether a remaining repair resource exists based on the available repair resource and the solution of the CSP, and
in response to a determination that the remaining repair resource exists, solve a Constraint Optimization Problem (COP) containing
the plurality of constraints, and
an objective function to be optimized, the objective function corresponding to the weight and the location of the at least one weak bit in the memory block.

16. The system of claim 15, wherein
the memory testing device is further configured to repair the memory, and
the processor is further configured to control the memory testing device to
in response to a determination that the remaining repair resource does not exist, repair the at least one fail bit using the available repair resource in accordance with the solution of the CSP, and
in response to the determination that the remaining repair resource exists, repair the at least one fail bit and the at least one weak bit using the available repair resource in accordance with a solution of the COP.

17. A computer program product, comprising a non-transitory, computer-readable medium containing instructions therein which, when executed by a processor, cause the processor to extract, from at least one memory test on a memory block of a memory,
- a fail bit pattern of a plurality of fail bits to be repaired in the memory block, and
- a weak bit pattern of a plurality of weak bits in the memory block, control marking the memory block as unrepairable or rejecting the memory, in response to any of
- a number of the plurality of fail bits is higher than a predetermined threshold,
- a machine learned function indicates, based on the fail bit pattern and an available repair resource in the memory for repairing the memory block, that the fail bit pattern is unrepairable, or
- a Constraint Satisfaction Problem (CSP) containing a plurality of constraints is not solvable, the plurality of constraints corresponding to (i) a location of each of the plurality of fail bits in the fail bit pattern and (ii) the available repair resource, and control repairing the memory based on either
- a solution of the CSP, the solution satisfying the plurality of constraints and indicating how the available repair resource is allocated in a repair of the plurality of fail bits, or
- a solution of a Constraint Optimization Problem (COP) containing the plurality of constraints and an objective function, the solution of the COP satisfying the plurality of constraints, optimizing the objective function, and indicating how the available repair resource is allocated in a repair of the plurality of fail bits and one or more weak bits among the plurality of weak bits, wherein the instructions, when executed by the processor, further cause the processor to
- assign a plurality of weights correspondingly to the plurality of weak bits, wherein, among the plurality of weights assigned to the plurality of weak bits, a higher weight is assigned to a weak bit with a higher weakness level and a lower weight is assigned to a weak bit with a lower weakness level,
- formulate the objective function of the COP based on the plurality of weights and locations of the plurality of weak bits in the memory block, and
- optimize the solution of the COP by optimizing the objective function of the COP, to preferentially repair the weak bit with the higher weight over the weak bit with the lower weight.

18. The computer program product of claim 17, wherein the instructions, when executed by the processor, further cause the processor to
optimize the solution of the CSP to minimize an amount of the available repair resource allocated to the repair of the plurality of fail bits.

19. The computer program product of claim 17, wherein the instructions, when executed by the processor, further cause the processor to
- perform machine learning to obtain the machine learned function from a database containing unrepairable bit patterns and corresponding available repair resources,
- in response to a determination that the CSP is not solvable, update the database by causing the fail bit pattern and the available repair resource to be added to the database, and
- perform said machine learning to update the function based on the updated database.

20. The system of claim 11, wherein
in the database, each of the unrepairable bit patterns was previously determined or labeled to be unrepairable given the corresponding available repair resource.

* * * * *